(12) United States Patent
Strakovsky

(10) Patent No.: US 6,586,992 B1
(45) Date of Patent: Jul. 1, 2003

(54) SYSTEM AND METHOD FOR INCREASING POWER RANGE IN A POWER AMPLIFIER USING A SINGLE VOLTAGE SUPPLY

(75) Inventor: Leonid Strakovsky, Rumson, NJ (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 09/971,400

(22) Filed: Oct. 5, 2001

Related U.S. Application Data
(60) Provisional application No. 60/240,660, filed on Oct. 16, 2000.

(51) Int. Cl.$^7$ .............................................. H03F 1/14
(52) U.S. Cl. ......................................... 330/51; 330/297
(58) Field of Search .......................... 330/51, 127, 136, 330/297

(56) References Cited

U.S. PATENT DOCUMENTS 5,347,230 A * 9/1994 Noro ........................... 330/297
6,107,862 A * 8/2000 Mukainakano et al. ..... 327/536

* cited by examiner

Primary Examiner—Steven J. Mottola
(74) Attorney, Agent, or Firm—Thomas, Kayden, Horstemeyer & Risley

(57) ABSTRACT

A system and method for providing additional voltage to an amplifier circuit, wherein the voltage is supplied using a single voltage supply and the amplifier voltage rail is configured to track the amplitude of the input signal.

22 Claims, 19 Drawing Sheets

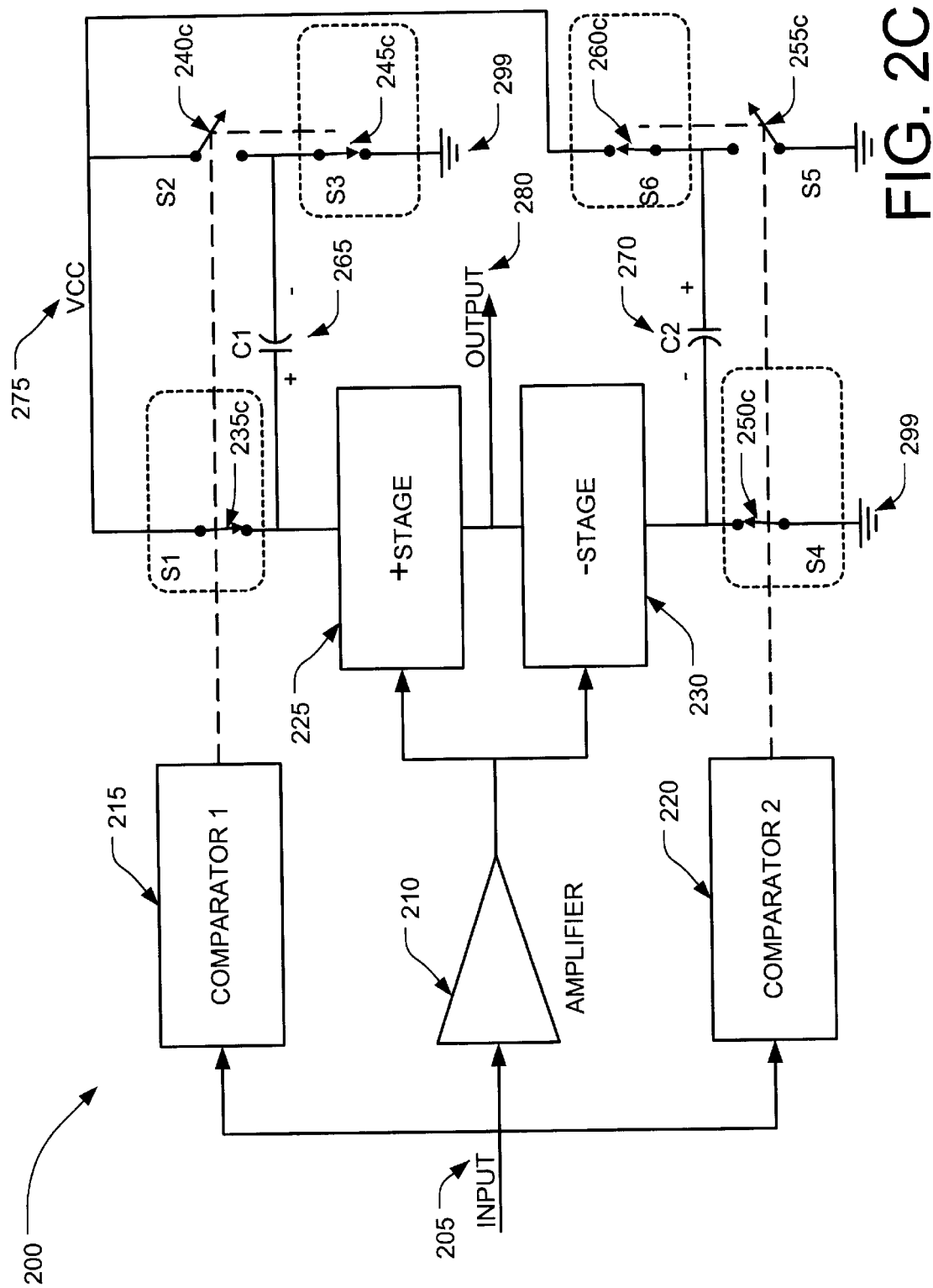

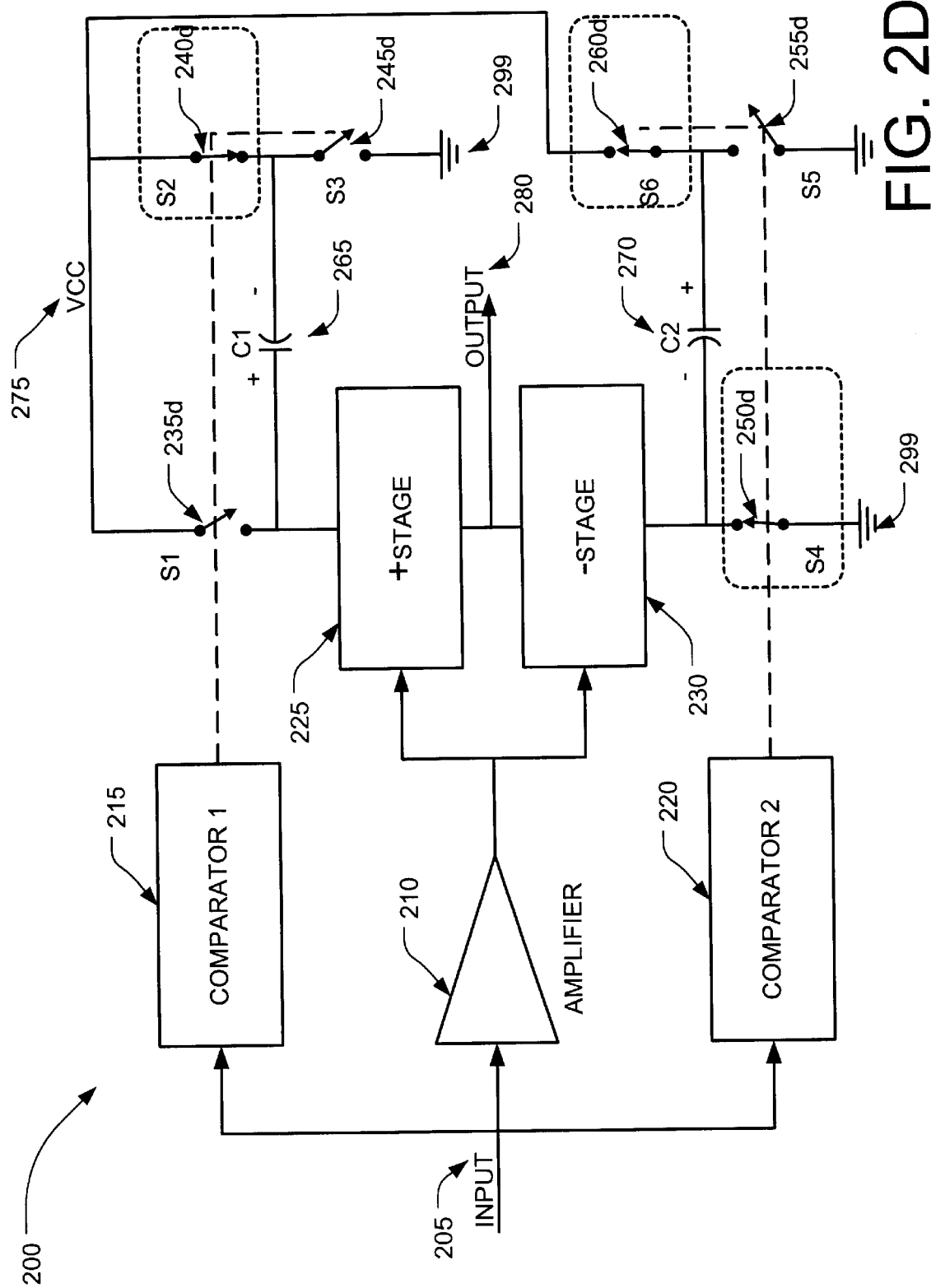

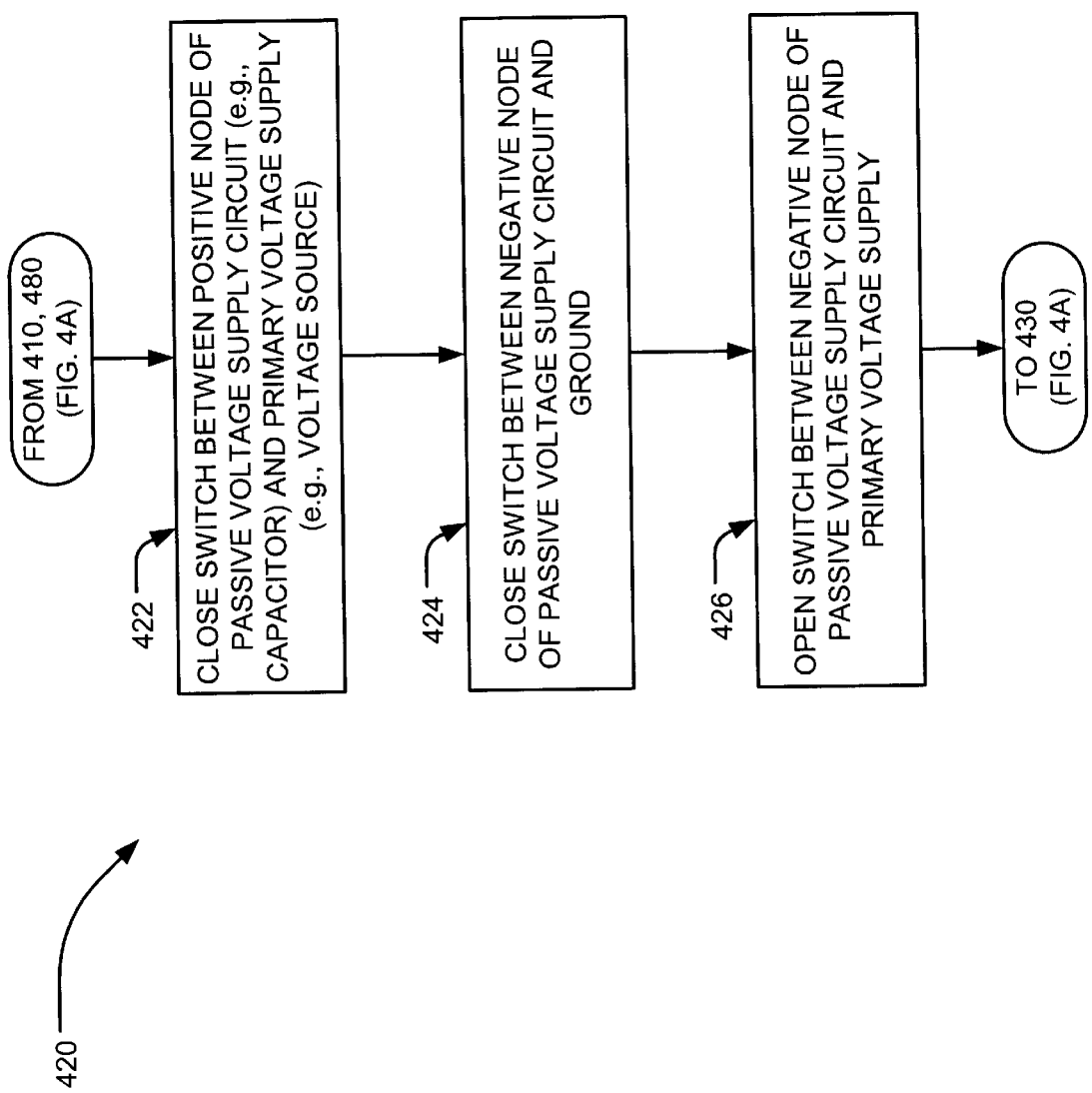

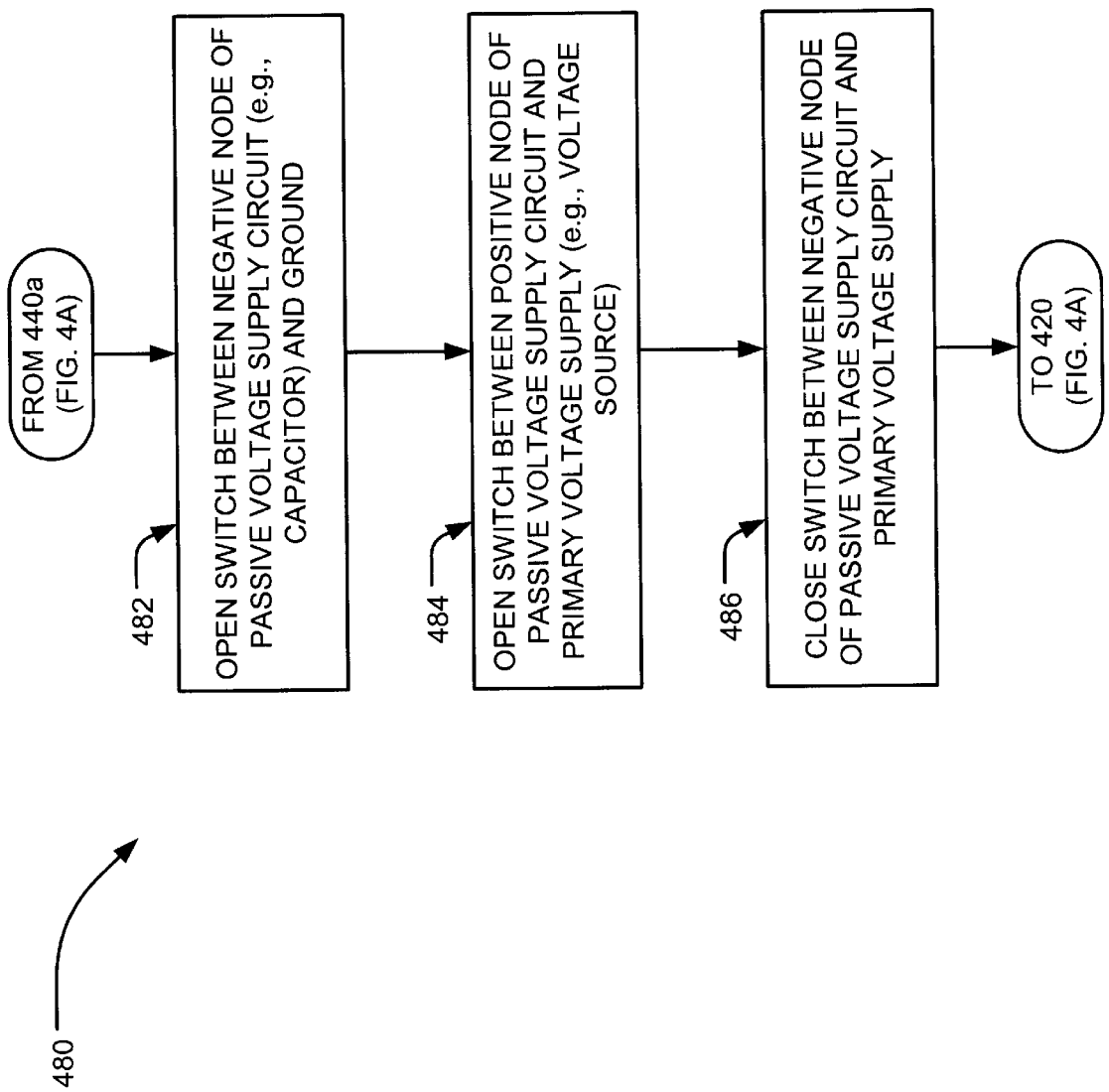

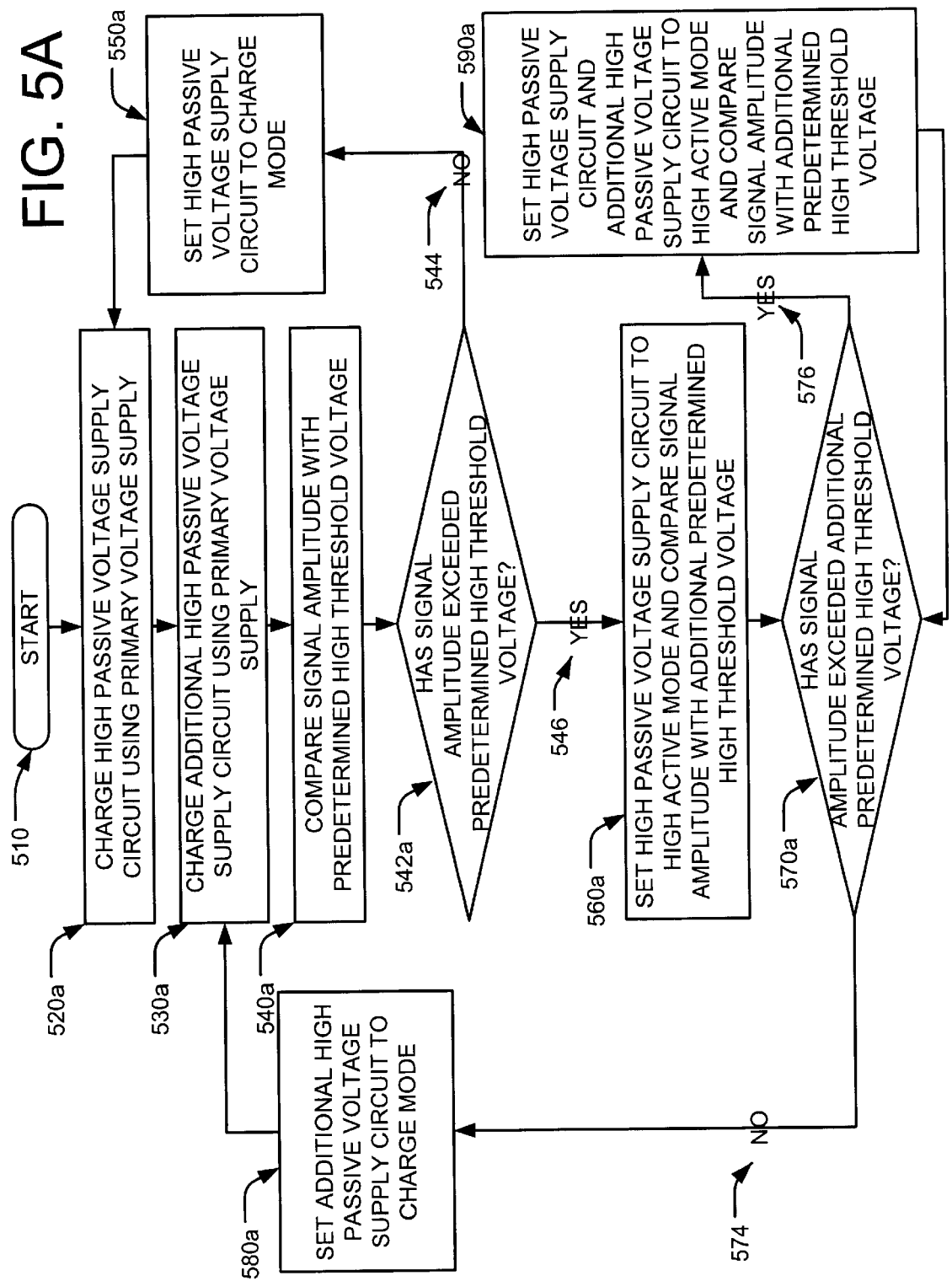

SYSTEM AND METHOD FOR INCREASING POWER RANGE IN A POWER AMPLIFIER USING A SINGLE VOLTAGE SUPPLY

CROSS REFERENCE TO RELATED APPLICATIONS

This application claims the benefit of U.S. Provisional Patent Application No. 60/240,660, dated Oct. 16, 2000, which is incorporated herein by reference in its entirety.

FIELD OF INVENTION

This invention relates generally to power amplifier circuits, and more particularly to a system and method for providing input-signal-dependent power-amplifier output-voltage rails.

BACKGROUND

Typically, amplifiers must be able to amplify a wide range of input signals. This usually requires the amplifier to have large power-supply "rails" (high-voltage supplies that connect across the output transistors that are used to "drive" the load). A problem arises, however, when an amplifier is amplifying small signals. In amplifying small signals, there is a small voltage that is developed across the load and, also, a current, which passes through the load as well as through the transistors. Unfortunately, the power transistors drop the balance of the supply voltage across themselves while supplying the load current. This leads to a substantial dissipation in power across the power transistors, and, hence, a substantial inefficiency with respect to amplification of small signals when using large voltage rails.

Efforts have been made to mitigate this problem by using additional voltage supplies (i.e., voltage sources), each having a different voltage potential, thereby allowing the voltage rails to switch from one voltage source to another as the magnitude of the input voltage changes. This approach allows for greater efficiency because the power dissipation may be minimized by tracking the voltage rails to the magnitude of the input signal. However, this approach is cumbersome because it requires multiple voltage sources in order to realize the different voltage rails. In light of this deficiency, there is a need in the art for a system and method of increasing power-amplifier efficiency without increasing the number of voltage supplies.

SUMMARY

The present invention provides a system and method for selectively providing varying voltages to an amplifier circuit as a function of the input voltage.

Briefly described, a system and method are provided for variably adjusting voltage rails, whereby a passive voltage supply circuit is charged by a primary voltage supply circuit, and the charged passive voltage supply circuit is used to provide additional voltage to a power amplifier when an input signal exceeds a predetermined threshold voltage.

In architecture, the system comprises a capacitor circuit that is connected to several switches. These switches, when configured in charge mode, connect the capacitor circuit between two voltage potentials, thereby allowing the capacitor to charge. Additionally, the switches, when configured in active mode, place the capacitor circuit serially between the voltage source and the power amplifier, thereby supplying added voltage to the amplifier. The system further comprises a control circuit, which controls the switching function described above. The control circuit comprises a comparator circuit, which compares an input signal to a predetermined threshold voltage. When the input voltage remains below the predetermined threshold voltage, the control circuit places the switches in charge mode, thereby charging the capacitor circuit. However, when the input voltage exceeds the predetermined threshold voltage, the control circuit places the switches in active mode, thereby using the stored charge to supplement the voltage source and, hence, increasing the voltage rail.

In accordance with another aspect of the present invention, a method is provided for selectively varying the voltage rail of a power amplifier as a function of the input voltage. The method can be broadly conceptualized as charging a capacitor circuit, comparing an input signal with a predetermined threshold voltage, and producing a control signal that selectively activates the capacitor circuit to provide added voltage to the amplifier when the input signal exceeds the predetermined threshold.

Other systems, methods, features, and advantages of the invention will be, or become, apparent to one with skill in the art upon examination of the following figures and detailed description. It is intended that all such additional systems, methods, features, and advantages be included within the scope of the invention, and be protected by the accompanying claims.

BRIEF DESCRIPTION OF THE DRAWINGS

The above and further features, advantages, and benefits of the present invention will be apparent upon consideration of the following detailed description, taken in conjunction with the accompanying drawings, in which like reference characters refer to like parts throughout.

FIG. 2C is a block diagram showing the circuit of FIG. 2A in charge mode, wherein the circuit operates between ground and +VCC.

FIG. 2D is a block diagram showing the circuit of FIG. 2A in high-active mode, wherein the circuit operates between ground and approximately +2VCC.

FIG. 4B is a flow chart showing the initial charging step of FIG. 4A in greater detail.

FIG. 4C is a flow chart showing the step of setting the circuit of FIG. 2A to high-active mode in greater detail.

FIG. 5A is a flow chart showing the method steps associated with the circuit diagrams of FIGS. 3B, 3C, and 3E.

DETAILED DESCRIPTION OF DRAWINGS

Figure 1:
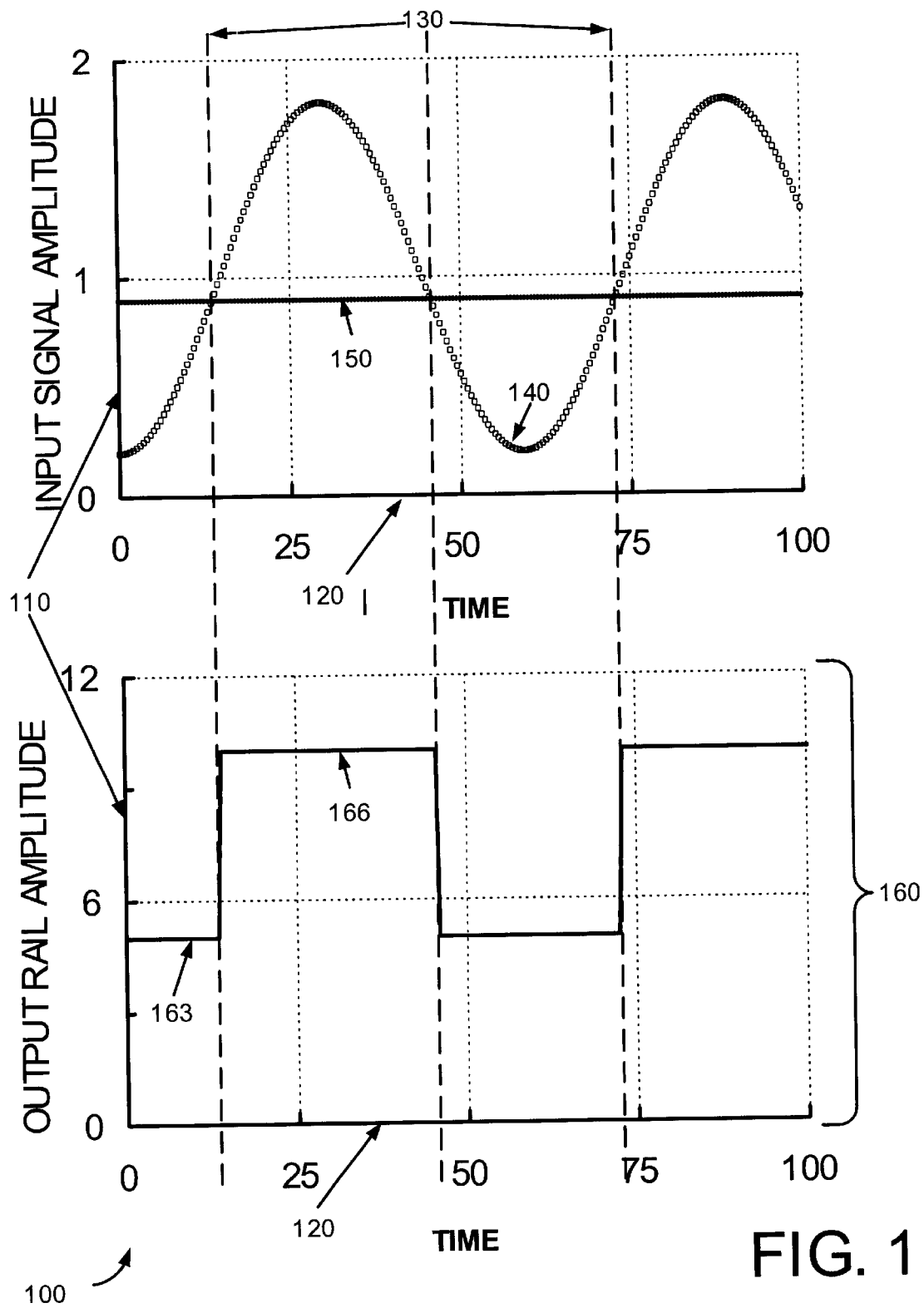
FIG. 1 is a graph showing the operation of a secondary voltage supply when the amplitude of a signal exceeds a predetermined threshold value.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

FIG. 1 is a graph showing the operation of a secondary passive voltage supply (e.g., a capacitor circuit) when the amplitude of a signal exceeds a predetermined threshold value. While the non-limiting example shows a sine wave to illustrate the operation of one embodiment of the invention, it will be clear to one of ordinary skill in the art that the system operates in similar fashion for any arbitrary wave shape. Thus, the sine wave in FIG. 1 is merely used for purposes of illustration and is not intended to limit the scope of the invention.

In this non-limiting example 100, signal magnitude 110 (or voltage) is plotted as a function of time 120 for a sine wave shaped input signal 140, a power amplifier voltage rail 160, and a predetermined threshold voltage 150. The top graph shows the input signal 140 while the lower graph shows the switching of the output voltage rail 160 as the input signal 140 fluctuates above and below the predetermined threshold 150. As shown in FIG. 1, when the input signal 140 remains below the threshold voltage 150, the voltage rail 160 remains at a lower output 163, thereby minimizing the dissipated power and, hence, maximizing efficiency. As the input signal 140 increases, at the crossover point 130 where the input signal 140 exceeds the predetermined threshold 150, the voltage rail 160 switches from a lower output 163 to a higher output 166, thereby allowing amplification of larger input signals 140. As the input signal 140 amplitude decreases and drops below the predetermined threshold 150, the voltage rail 160 drops from the higher output 166 back to the lower output 163, thereby, once again, reducing power dissipation across the power amplifier. As shown in FIG. 1, having the voltage rail 160 track the input signal 140 provides for decreased power losses due to power dissipation. FIGS. 2A through 3F provide non-limiting examples of systems that are configured to implement this type of behavior using a single active voltage supply (e.g., a voltage source) while FIGS. 4A through 5B provide non-limiting examples of methods that are designed to achieve this end. For clarity, the closed switches, in FIGS. 2A through 3F, are enclosed in broken lines. Also, while FIG. 1 illustrates the switching operation of only one passive voltage supply circuit, it will be clear to one of ordinary skill in the art that the other passive voltage supply circuits operate in similar fashion.

System

Figure 2A:
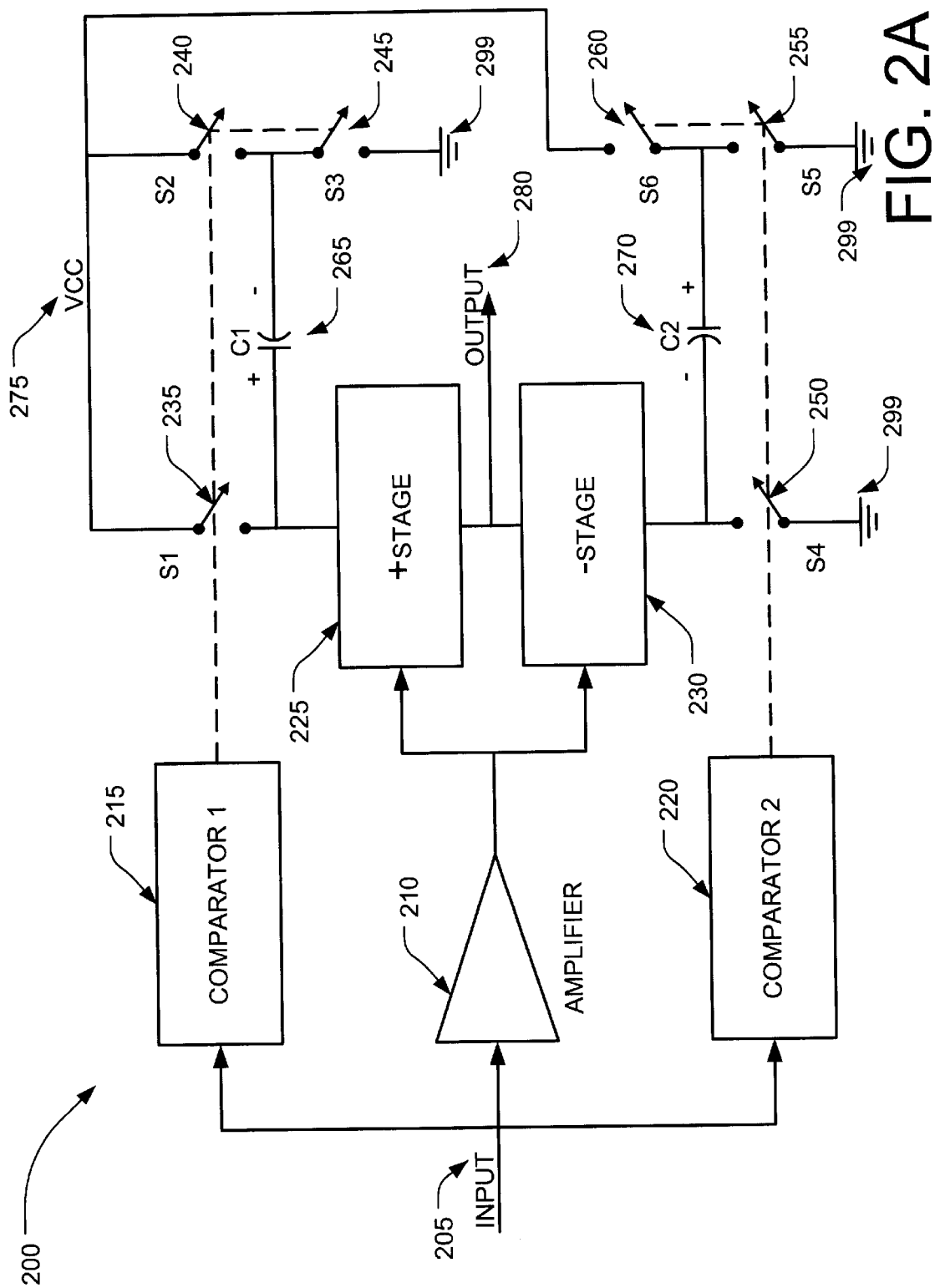
FIG. 2A is a block diagram of a circuit configured to effectively increase the output voltage rail from an initial range between ground and +VCC to a range between approximately −VCC and approximately +2VCC.

FIG. 2A is a block diagram of a two-capacitor circuit 200 configured to effectively increase the output voltage rail 160 (FIG. 1) from an initial range of between ground 299 and +VCC 275 to a range of between approximately −VCC and approximately +2VCC. In the non-limiting example of FIG. 2A, the two-capacitor circuit 200 comprises an amplifier 210 having input 205 and an output 280. The two-capacitor circuit 200 further comprises a first capacitor circuit 265, situated between several switches, S1 235, S2 240, and S3 245. These switches 235, 240, 245, which are associated with the first capacitor circuit 265, are configured to be controlled by a first comparator 215. The first comparator 215 is configured to compare the input signal 205 with a first predetermined threshold voltage (also referred to as a predetermined high threshold voltage), and selectively open and close switches S1 235, S2 240, and S3 245, thereby selectively connecting or removing the first capacitor circuit 265 between the voltage source 275 and the plus-stage 225 of the amplifier circuit. In addition to the first capacitor circuit 265, the two-capacitor circuit 200 further comprises a second capacitor circuit 270, situated between switches, S4 250, S5 255, and S6 260, which are associated with the second capacitor circuit 270, and are configured to be controlled by a second comparator 220. The second comparator 220 is configured to compare the input signal 205 with a second predetermined threshold voltage (also referred to as a predetermined low threshold voltage), and selectively open and close switches S4 250, S5 255, and S6 260, thereby selectively connecting or removing the second capacitor circuit 270 between the voltage source 275 and the minus-stage 225 of the amplifier circuit. Thus, as one can see from the setup of the circuit in the non-limiting example of FIG. 2A, the capacitor circuits 265, 270 may be removed from the circuit (herein referred to as "charge mode") to reduce undesirable power dissipation. Furthermore, the capacitor circuits 265, 270 may be used to supplement the active voltage source 275 when the amplifier circuit needs additional voltage (hereinafter referred to as "active mode"). The charge mode and active mode operations of the two-capacitor circuit 200 is shown in greater detail in FIGS. 2C, 2D, and 2E.

Figures 1, 2B:
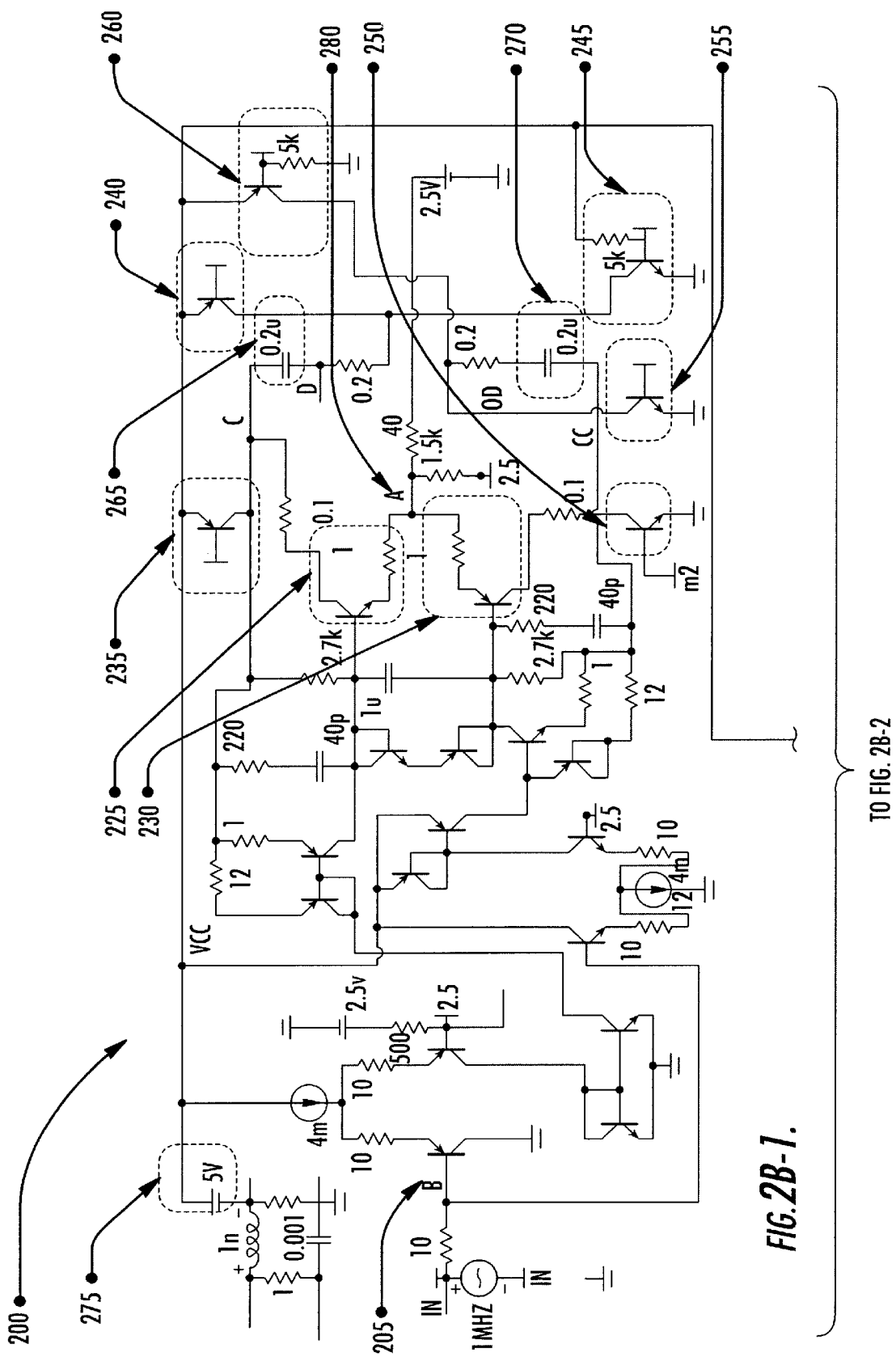
FIG. 2B is a diagram showing the individual circuit components in a preferred embodiment of the block diagram of FIG. 2A.
Figures 2, 2B:
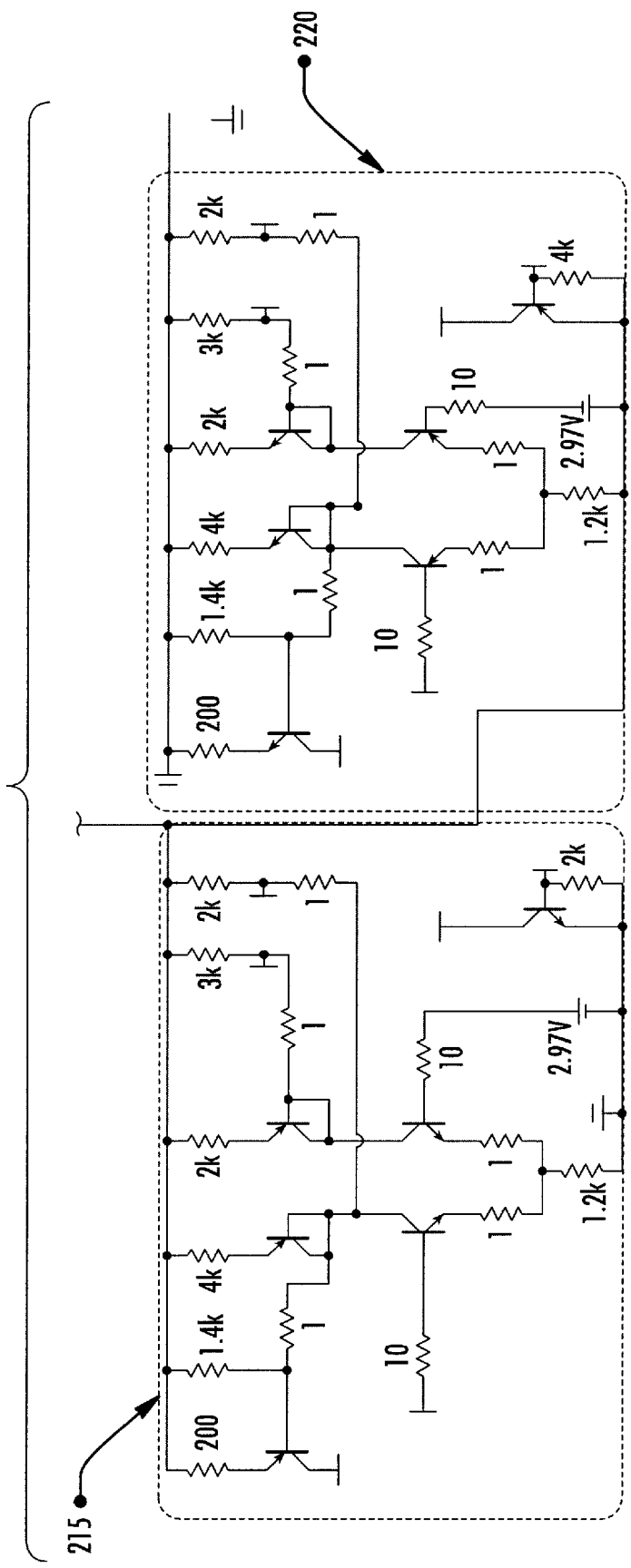

FIG. 2B is a diagram showing the individual circuit components associated with the block diagram of FIG. 2A. Although there are a variety of ways to implement circuit components to achieve the desired result, the preferred embodiment of FIG. 2B shows the implementation of the circuit using transistors, resistors, and capacitors. For convenience, circuit components of FIG. 2B are highlighted in broken lines and labeled so as to correspond to their respective blocks in FIG. 2A. For example, in the preferred embodiment of FIG. 2B, switch S1 235 is represented by transistor Q7 235, switch S2 240 is represented by transistor Q8 240, etc. Similarly the transistor-resistor circuit 215 is the circuit that represents the first comparator 215. The remaining items in FIG. 2B, which are not enclosed in broken lines, represent the circuit components associated with the amplifier 210.

FIG. 2C is a block diagram showing the two-capacitor circuit 200 of FIG. 2A in charge mode, wherein the two-capacitor circuit 200 operates between ground 299 and +VCC 275. When the input voltage 205 stays within the voltage rails 160 (FIG. 1) of the amplifier 210, the first comparator 215 is configured to close switches S1 235c and S3 245c while keeping switch S2 240c open. This connects the capacitor C1 265 between +VCC 275 and ground 299, thereby charging capacitor C1 265 while supplying a voltage of +VCC 275 to the plus-stage 225 of the amplifier circuit. Additionally, so long as the input voltage 205 stays within the voltage rails 160 (FIG. 1), the second comparator 220 is configured to close switches S4 250c and S6 260c while keeping switch S5 255c open. This connects capacitor C2 270 between +VCC 275 and ground 299, thereby charging capacitor C2 270 with a voltage of +VCC 275 while grounding the minus-stage 230 of the amplifier circuit. Thus, in charge mode, both capacitors 265, 270 remain charging while the power amplifier operates between the voltage rails 160 (FIG. 1) of ground 299 (i.e., zero volts) and +VCC 275, thereby limiting the power dissipation to an output proportional to the difference between the input signal 205 and +VCC 275 while in charge mode.

FIG. 2D is a block diagram showing the two-capacitor circuit 200 of FIG. 2A in high active mode, wherein the circuit operates between ground 299 and approximately +2VCC. When the input voltage 205 exceeds a predetermined high threshold voltage (e.g., an input voltage that would cause the output to exceed the voltage rail of +VCC 275), the first comparator 215 is configured to open switches S1 235d and S3 245d while closing switch S2 240d. This serially connects the previously-charged capacitor C1 265 between +VCC 275 and the plus-stage 225 of the power amplifier circuit, thereby allowing capacitor C1 265 to act as an additional voltage supply. This raises the high voltage rail 166 (FIG. 1) from +VCC 275 to approximately +2VCC, thereby allowing amplification of larger signals (i.e., signal amplitudes having an output of up to approximately +2VCC) than that permitted by the two-capacitor circuit 200 operating in charge mode. So long as the capacitor C1 265 discharges at a fairly slow rate, it is possible to maintain the upper voltage rail 166 (FIG. 1) at approximately +2VCC for a reasonable duration. Once the input signal 205 drops below the predetermined high threshold voltage, the first comparator 215 switches the two-capacitor circuit 200 back to charge mode as shown in FIG. 2B, thereby recharging capacitor C1 265 for the next active mode. Since, in this non-limiting example, only one voltage source +VCC 275 is used, the circuit of FIG. 2D allows for dynamic changes in the voltage rail 166 (FIG. 1) without cumbersome additional voltage sources. Also, minimum power dissipation results because, to some extent, the voltage rail 160 (FIG. 1) tracks the input voltage 205.

Figure 2E:
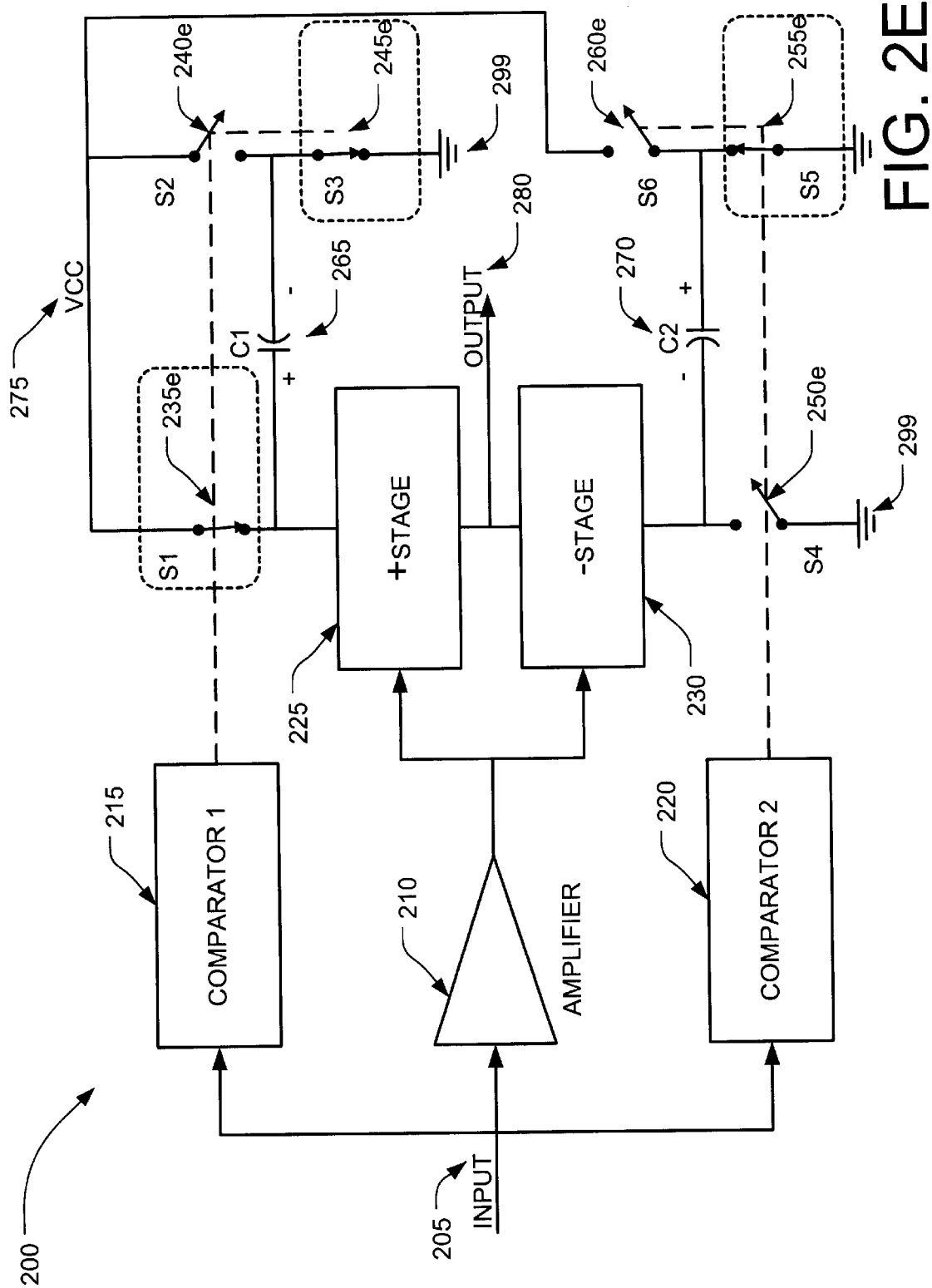
FIG. 2E is a block diagram showing the circuit of FIG. 2A in low-active mode, wherein the circuit operates between approximately −VCC and +VCC.

FIG. 2E is a block diagram showing the circuit of FIG. 2A in low active mode, wherein the circuit operates between approximately –VCC and +VCC 275. When the input voltage 205 drops below a predetermined low threshold voltage (e.g., an input voltage that causes the output to drop to approximately ground 299 or zero), the second comparator 220 is configured to open switches S4 250e and S6 260e while closing switch S5 255e. This serially connects the previously-charged capacitor C2 270 between ground 299 and the minus-stage 230 of the power amplifier circuit, thereby allowing capacitor C2 270 to act as an additional voltage supply having a supply voltage of approximately –VCC. This lowers the low voltage rail 160 (FIG. 1) from ground 299 to approximately –VCC, thereby allowing amplification of negative swinging signals (i.e., signal amplitudes having an output that drops below zero to approximately –VCC), which were not permitted by the two-capacitor circuit 200 operating in charge mode. So long as the capacitor C2 270 discharges at a fairly slow rate, it is possible to maintain the lower voltage rail 160 (FIG. 1) at approximately –VCC for a reasonable duration. Once the input signal 205 rises above the predetermined low threshold voltage, the second comparator 220 switches the two-capacitor circuit 200 back to charge mode as shown in FIG. 2B, thereby recharging capacitor C2 270 for the next low-active mode. Again, since only one voltage source 275 is used, the circuit of FIG. 2E allows for dynamic changes in the voltage rail 160 (FIG. 1) without cumbersome additional voltage sources. Also, minimum power dissipation results because, to some extent, the voltage rails 160 (FIG. 1) track the input voltage 205.

It is worthwhile to note that, while the non-limiting example of FIGS. 2A through 2E show the two-capacitor circuit 200 operating between ground 299 and +VCC 275, a second voltage potential (e.g., VCC2) may be used instead of ground 299 to allow an initial voltage rail between VCC 275 and VCC2. Additionally, it will be clear to one of ordinary skill in the art that the comparators 215, 220 may be implemented as either analog circuits or digital comparators without deviating from the scope of the invention. Furthermore, it will be clear to one of ordinary skill in the art that, while the illustrated embodiments show the power amplifier circuit having its output load connected to ground, the circuit may be configured as a balanced amplifier circuit where the output load is connected between the outputs of two amplifier circuits. Thus, if the circuit were configured as a balanced amplifier circuit, a single comparator may be used to monitor both the high threshold and the low threshold, thereby triggering both the high active mode and the low active mode simultaneously.

FIGS. 3A through 3F are block diagrams showing another embodiment of the invention. These figures illustrate an additional layer cascaded together with the two-capacitor circuit 200 of FIG. 2A. The additional layer effectively increases the output voltage rail 160 (FIG. 1) from an initial range between ground 299 and +VCC 275 to a range between approximately –2VCC and approximately +3VCC. As shown in the non-limiting example of FIG. 3A, an additional layer of capacitors, comparators, and switches may be added to the circuit of FIG. 2A to provide even higher voltage rails 160 (FIG. 1), which allows for amplification of an even larger range of input signals 205. In architecture, the additional layer is similar to the capacitor-comparator-switch network of FIG. 2A. The additional layer comprises a third capacitor circuit 365, situated between several switches, S7 335, S8 340, and S9 345. These switches 335, 340, 345, which are associated with the third capacitor circuit 365, are configured to be controlled by a third comparator 315. The third comparator 315 is configured to compare the input signal 205 with a third predetermined threshold voltage (also referred to as an additional predetermined high threshold voltage), and selectively open and close switches S7 335, S8 340, and S9 345, thereby selectively connecting or removing the third capacitor circuit 365 between the voltage source 275 and the first capacitor circuit 265. In addition to the third capacitor circuit 365, the four-capacitor circuit 300 further comprises a fourth capacitor circuit 370, situated between switches, S10 350, S11 355, and S12 360, which are associated with the fourth capacitor circuit 370, and are configured to be controlled by a fourth comparator 320. The fourth comparator 320 is configured to compare the input signal 205 with a fourth predetermined threshold voltage (also referred to as an additional predetermined low threshold voltage), and selectively open and close switches S10 350, S11 355, and S12 360, thereby selectively connecting or removing the fourth capacitor circuit 370 between the voltage source 275 and the second capacitor circuit 270. In one embodiment, the first predetermined threshold approximates the input that results in an output of approximately +VCC 275 and the third predetermined threshold approximates the input that results in an output of approximately +2VCC. Thus, allowing the switches S1 235, S2 240, and S3 245 to trigger when the input signal 205 causes the output signal to reach approximately +VCC, and switches S7 335, S8, 340, and S9 345 to trigger when the input signal 205 causes the output to reach approximately +2VCC. Also, in this embodiment, the second and fourth predetermined threshold voltages are set to approximate the input voltages that result in an output of ground 299 and −VCC, respectively. This triggers switches S4 250, S5 255, and S6 260 when the input signal 205 causes the output to approach ground 299, and triggers switches S10 350, S11 355, and S12 360 when the input signal 205 causes the output to approach −VCC.

Figure 3A:
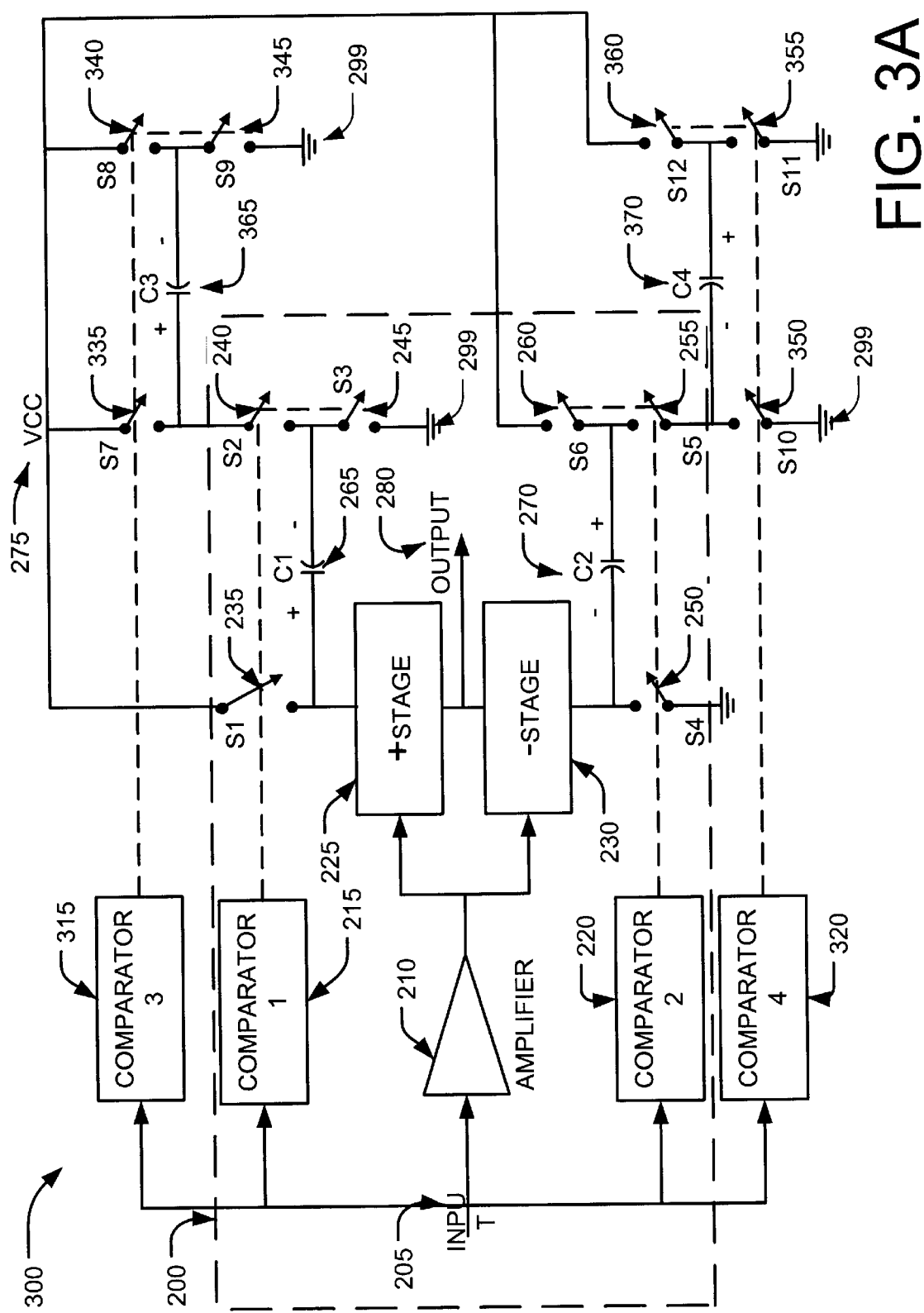
FIG. 3A is a block diagram showing an additional layer to the circuit of FIG. 2A, wherein the additional layer effectively increases the output voltage rail from an initial range between ground and +VCC to a range between approximately −2VCC and approximately +3VCC.

Thus, as one can see from the setup of the circuit in the non-limiting example of FIG. 3A, the capacitor circuits 365, 370 may operate in charge mode to reduce undesirable power dissipation, or, in the alternative, operate in active mode to allow amplification of higher amplitude input signals 205. The charge mode and active mode operations of the four-capacitor circuit 300 is shown in greater detail in FIGS. 3B, 3C, 3D, 3E, and 3F.

Figure 3B:
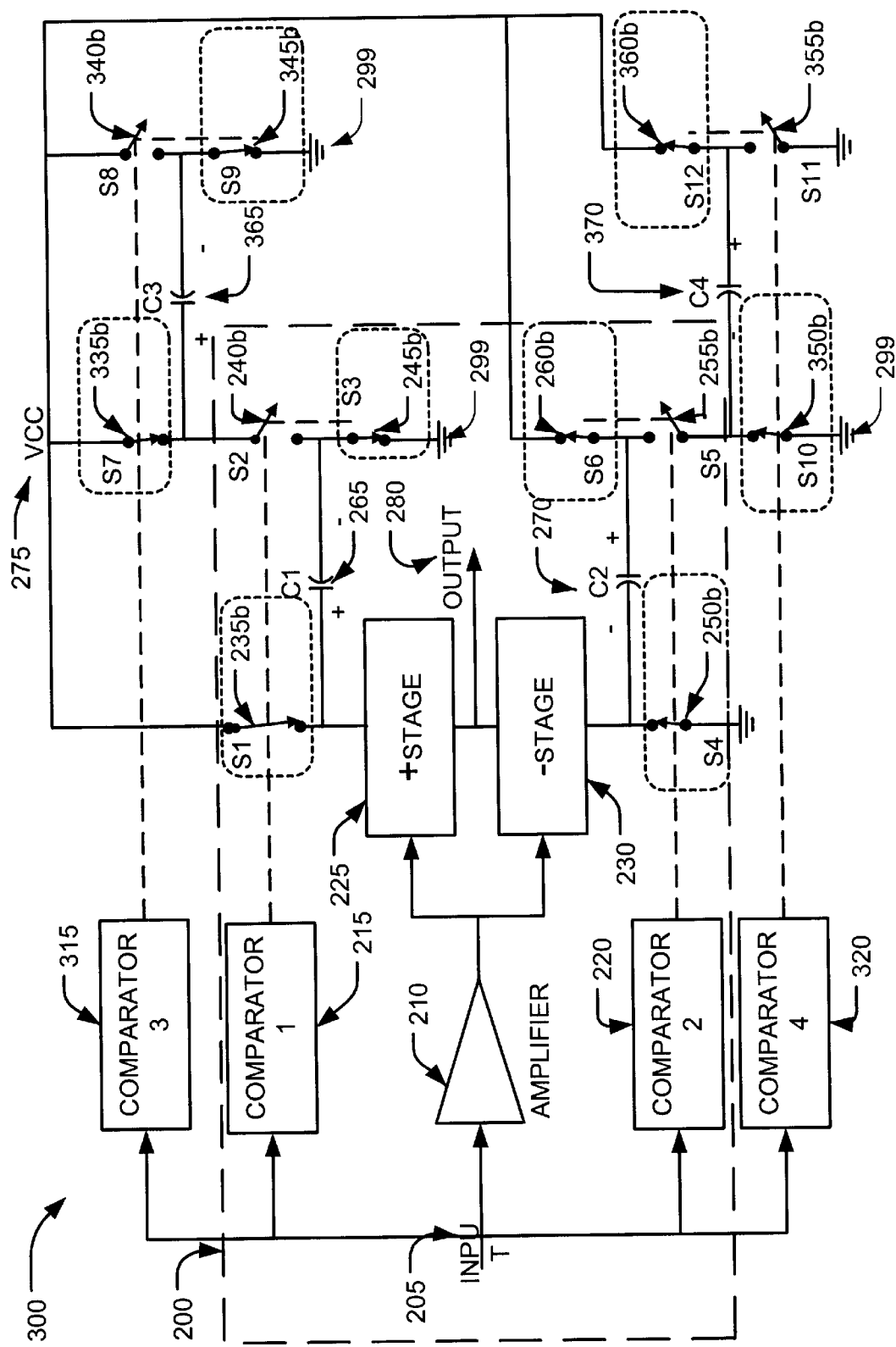
FIG. 3B is a block diagram showing the circuit of FIG. 3A in charge mode, wherein the circuit operates between ground and +VCC.

FIG. 3B is a block diagram showing the four-capacitor circuit 300 of FIG. 3A in charge mode, wherein all four capacitors C1 265, C2 270, C3 365, and C4 370 of the four-capacitor circuit 300 are connected between ground 299 and +VCC 275. Similar to the non-limiting example of FIG. 2C, when the input voltage 205 stays below a first predetermined threshold voltage (e.g., the input voltage that results in an output that is within the voltage rails 160 (FIG. 1) of the amplifier 210), the first comparator 215 is configured to close switches S1 235c and S3 245c while keeping switch S2 240c open. This connects the capacitor C1 265 between +VCC 275 and ground 299, thereby charging capacitor C1 265 while supplying a voltage of +VCC 275 to the plus-stage 225 of the amplifier circuit. Additionally, so long as the input voltage 205 remains above a second predetermined threshold voltage, the second comparator 220 is configured to close switches S4 250c and S6 260c while keeping switch S5 255c open. This connects capacitor C2 270 between +VCC 275 and ground 299, thereby charging capacitor C2 270 with a voltage of +VCC 275 while grounding the minus-stage 230 of the amplifier circuit.

The additional layer, which is cascaded together with the two-capacitor circuit 200 of FIG. 2A, operates in a similar manner. Thus, so long as the input voltage 205 stays below a third predetermined threshold voltage, which is typically higher than the first predetermined threshold voltage, the third comparator 315 closes switches S7 335 and S9 345 while keeping switch S8 340 open. This connects capacitor C3 365 between +VCC 275 and ground 299, thereby charging capacitor C3 365. Furthermore, so long as the input voltage 205 stays above a fourth predetermined threshold voltage, which is typically below that of the second predetermined threshold voltage, the fourth comparator 320 closes switches S10 350 and S12 360 while opening switch S1 365. This connects capacitor C4 370 between +VCC 275 and ground 299, thereby charging capacitor C4 365.

In charge mode, therefore, all four capacitors 265, 270, 365, 370 remain charging while the power amplifier circuit operates between the voltage rails 160 (FIG. 1) of ground 299 and +VCC 275, thereby limiting the power dissipation to an amount proportional to the difference between the input signal 205 and +VCC 275.

Figure 3C:
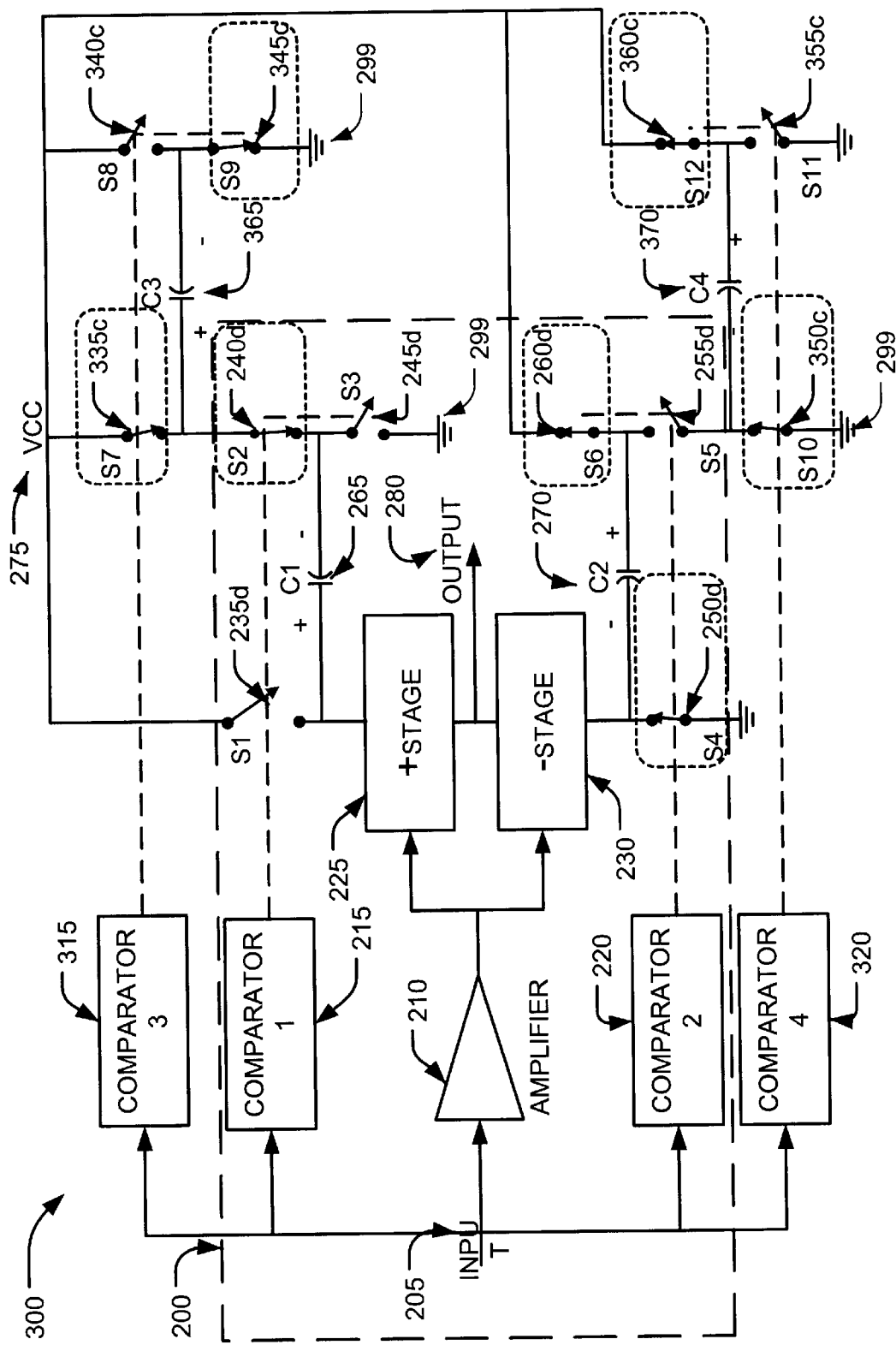
FIG. 3C is a block diagram showing the circuit of FIG. 3A in a first high-active mode, wherein the circuit operates between ground and approximately +2VCC.

FIG. 3C is a block diagram showing the four-capacitor circuit 300 of FIG. 3A in a first high-active mode, wherein the four-capacitor circuit 300 operates between ground 299 and approximately +2VCC. In this non-limiting example, referred to as the first high-active mode, the input signal 205 exceeds the first predetermined threshold voltage while remaining below the third predetermined threshold voltage. Hence, the additional layer remains dormant while C1 265 of the four-capacitor circuit 300 provides additional voltage to the amplifier circuit, and the operation of the four-capacitor circuit 300 mimics the operation of the two-capacitor circuit 200 as shown in FIG. 2D. Since, in this non-limiting example, the first predetermined threshold voltage is lower than the third predetermined threshold voltage, when the input voltage 205 exceeds the first predetermined high threshold voltage but does not exceed the third predetermined threshold voltage, the first comparator 215 opens switches S1 235d and S3 245d while closing switch S2 240d. This serially connects the previously-charged capacitor C1 265 between +VCC 275 and the plus-stage 225 of the power amplifier circuit, thereby allowing capacitor C1 265 to act as an additional voltage supply. This raises the high voltage rail 166 (FIG. 1) from +VCC 275 to approximately +2VCC, thereby allowing amplification of larger signals (i.e., signal amplitudes that result in an output of up to approximately +2VCC) than those permitted in charge mode. Once the input signal 205 drops below the first predetermined threshold voltage, the four-capacitor circuit 300 resets to charge mode as shown in FIG. 3B, thereby recharging capacitor C1 265.

Figure 3D:
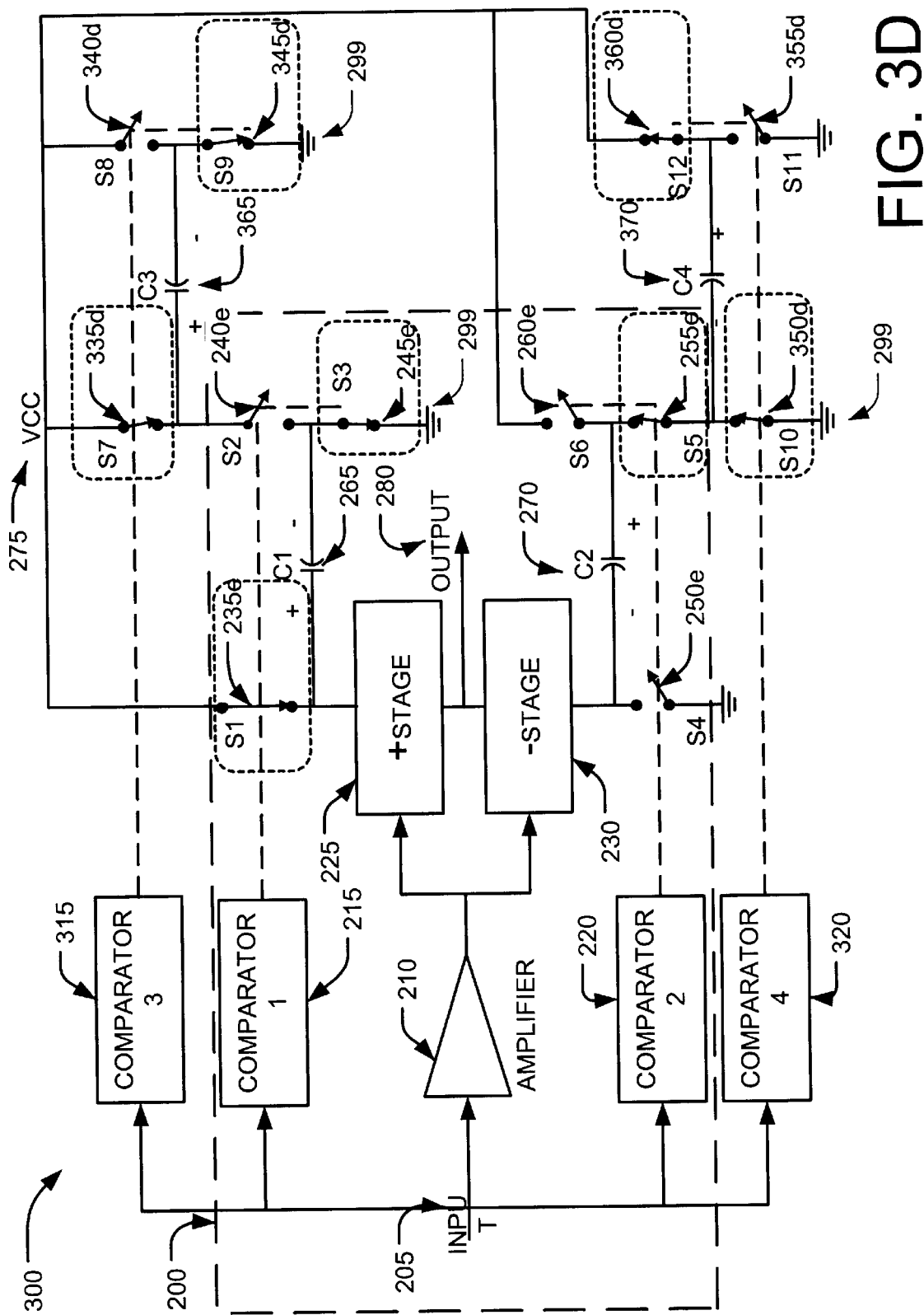
FIG. 3D is a block diagram showing the circuit of FIG. 3A in a first low-active mode, wherein the circuit operates between approximately −VCC and +VCC.

FIG. 3D is a block diagram showing the four-capacitor circuit 300 of FIG. 3A in a first low-active mode, wherein the four-capacitor circuit 300 operates between approximately −VCC and +VCC 275. In this non-limiting example, referred to as the first low-active mode, the input signal 205 drops below the second predetermined threshold voltage while remaining above the fourth predetermined threshold voltage. Hence, the additional layer once again remains dormant while C2 270 of the four-capacitor circuit 300 provides additional voltage to the amplifier circuit, and the operation of the four-capacitor circuit 300 mimics the operation of the two-capacitor circuit 200 as shown in FIG. 2E. Since, in this non-limiting example, the second predetermined threshold voltage is higher than the fourth predetermined threshold voltage, when the input voltage 205 drops below the second predetermined threshold voltage but does not drop below the fourth predetermined threshold voltage, the second comparator 220 opens switches S4 250e and S6 260e while closing switch S5 255e. This serially connects the previously-charged capacitor C2 270 between ground 299 and the minus-stage 230 of the power amplifier circuit, thereby allowing capacitor C2 270 to act as an additional voltage supply. This lowers the low voltage rail 160 (FIG. 1) from ground 299 to approximately −VCC, thereby allowing amplification of signals having a lower voltage than those permitted in charge mode. Once the input signal 205 rises above the second predetermined threshold voltage, the four-capacitor circuit 300 resets to charge mode as shown in FIG. 3B, thereby recharging capacitor C2 270.

Figure 3E:
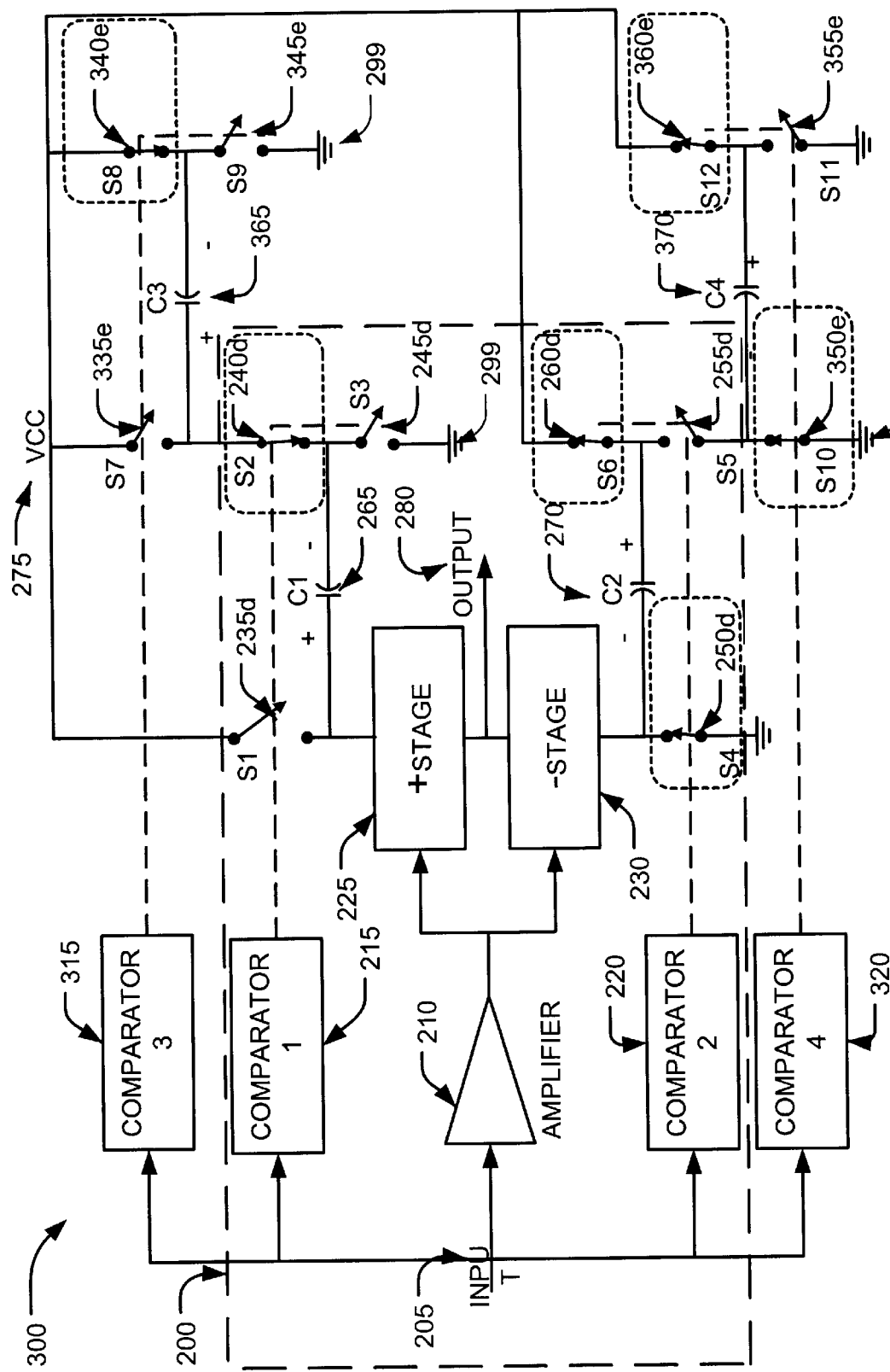
FIG. 3E is a block diagram showing the circuit of FIG. 3A in a second high-active mode, wherein the circuit operates between ground and approximately +3VCC.

FIG. 3E is a block diagram showing the four-capacitor circuit 300 of FIG. 3A in a second high-active mode, wherein the circuit operates between ground and approximately +3VCC. In this non-limiting example, referred to as the second high-active mode, the input signal 205 exceeds the third predetermined threshold voltage, thereby also exceeding the first predetermined threshold voltage. Hence, in FIG. 3E, C3 365 of the four-capacitor circuit 300 provides additional voltage to the amplifier circuit, thus, supplementing the power provided by C1 265 (as shown in FIG. 3C). Since both the first and third predetermined threshold voltages are exceeded, the first comparator 215 opens switches S1 235d and S3 245d while closing switch S2 240d, and the third comparator 315 opens switches S7 325e and S9 345e while closing switch S8 340e. This serially connects the previously-charged capacitors C1 265 and C3 365 between +VCC 275 and the plus-stage 225 of the power amplifier circuit, thereby allowing capacitors C1 265 and C3 365 to act as additional voltage supplies. This raises the high voltage rail 166 (FIG. 1) to approximately +3VCC since the voltage of both previously charged capacitors 265, 365 are now supplementing the voltage supply 275. This, in turn, allows amplification of larger signals than those permitted in charge mode (FIG. 3B) or first high-active mode (FIG. 3C). Once the input signal 205 drops below the third predetermined threshold voltage but remains above the first predetermined threshold voltage, the four-capacitor circuit 300 resets to first high-active mode as shown in FIG. 3C, thereby recharging capacitor C3 365. Furthermore, when the input signal 205 drops below the first predetermined threshold voltage, the four-capacitor circuit 300 resets to charge mode as shown in FIG. 3B, thereby recharging capacitors C1 265 and C3 365.

Figure 3F:
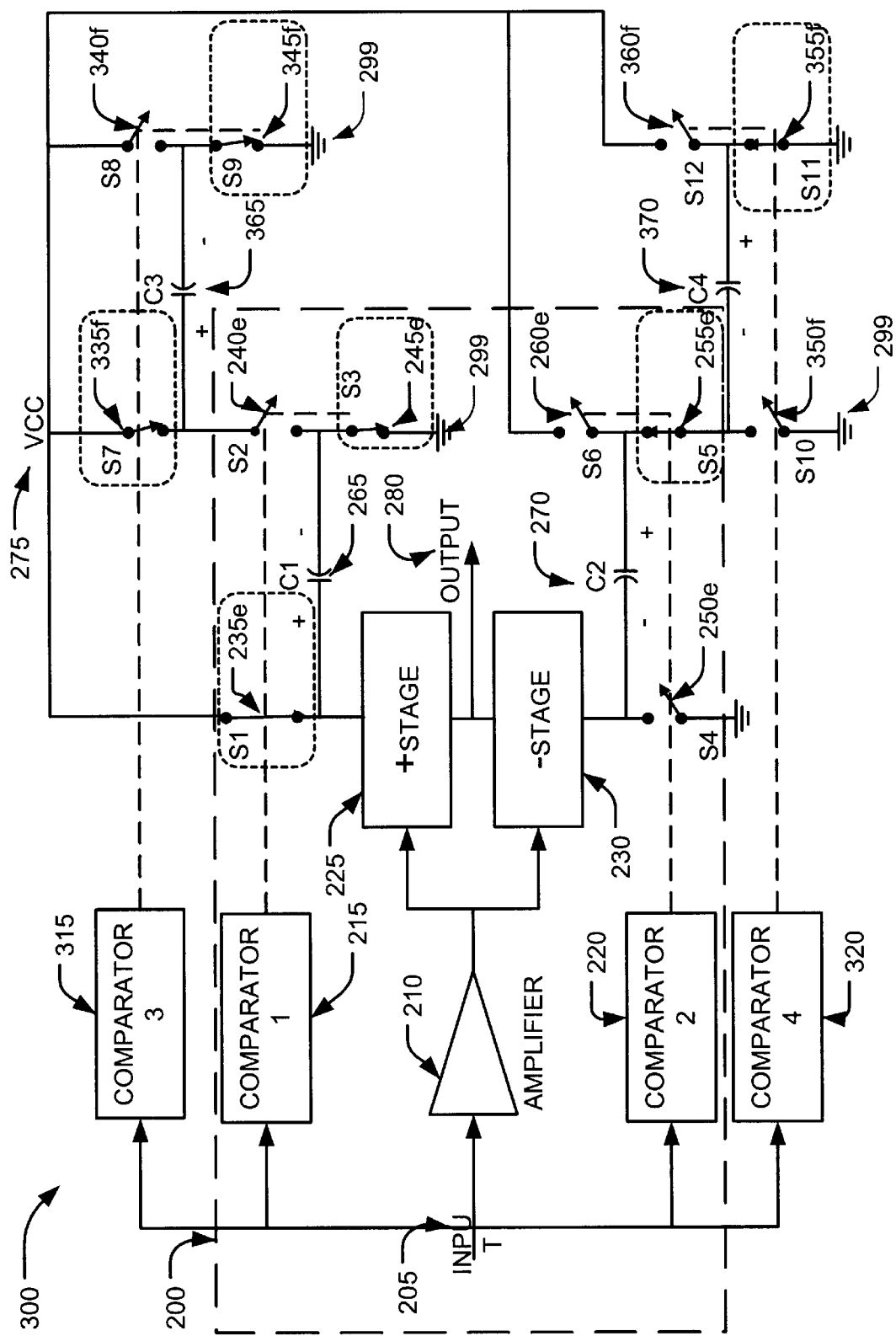
FIG. 3F is a block diagram showing the circuit of FIG. 3A in a second low-active mode, wherein the circuit operates between approximately −2VCC and +VCC.

FIG. 3F is a block diagram showing the four-capacitor circuit 300 of FIG. 3A in a second low-active mode, wherein the four-capacitor circuit 300 operates between approximately −2VCC and +VCC 275. In this non-limiting example, referred to as the second low-active mode, the input signal 205 drops below the fourth predetermined threshold voltage, thereby also dropping below the second predetermined threshold voltage. Hence, in FIG. 3F, C4 370 of the four-capacitor circuit 300 provides additional voltage to the amplifier circuit, thus, supplementing the power provided by C2 270 (as shown in FIG. 3D). Since the input signal 205 drops below both the second and fourth predetermined threshold voltages, the second comparator 220 opens switches S4 250e and S6 260e while closing switch S5 255e, and the fourth comparator 320 opens switches S10 350f and S12 360f while closing switch S11 355f. This serially connects the previously charged capacitors C2 270 and C4 370 between +VCC 275 and the minus-stage 230 of the power amplifier circuit, thereby allowing capacitors C2 270 and C4 370 to act as additional voltage supplies. This lowers the low voltage rail 166 (FIG. 1) to approximately −2VCC since the voltage of both previously charged capacitors 265, 365 are now driving the minus-stage 230 of the amplifier circuit. This, in turn, allows amplification of input signals 205 that cause the output to drop well below zero volts (i.e., below ground 299 potential). Once the input signal 205 rises above the fourth predetermined threshold voltage but remains below the second predetermined threshold voltage, the four-capacitor circuit 300 resets to first low-active mode as shown in FIG. 3D, thereby recharging capacitor C4 370. Furthermore, when the input signal 205 rises above the second predetermined threshold voltage, the four-capacitor circuit 300 resets to charge mode as shown in FIG. 3B, thereby recharging capacitors C2 270 and C4 370.

Although FIGS. 2A through 3F show only four levels of capacitative circuits, it will be cleat to one of ordinary skill in the art that additional capacitative layers may be added to further increase the range of input signals 205 that may be amplified by such a circuit. Also, while capacitors are used in the preferred embodiment of the invention, it will be clear to one of ordinary skill in the art that other rechargeable devices may be used without detracting from the scope of the invention. Additionally, since both digital and analog comparators are well known in the art, details regarding the operation of comparator circuits are not discussed herein. Furthermore, as noted above, while the preferred embodiment shows the voltage rails 160 (FIG. 1) as ground 299 and +VCC 275, it will be clear to one of ordinary skill in the art that voltage rails may be any two voltage potentials, whether positive or negative, that are configured to drive the amplifier circuit. Also, while the term "additional voltage supply" is used to describe the capacitor circuits, it will be clear to one of ordinary skill in the art that these sources of power differ from the active voltage source of +VCC 275. Moreover, while switching times play a role in the switching circuit, these effects may be determined and compensated for. Additionally, since the effect of switching times is well known, these effects are not discussed further.

These, and all such other changes, modifications, and alterations should therefore be seen as within the scope of the present invention.

Method

Another aspect of the present invention may be seen as a method for providing a dynamic voltage rail 160 (FIG. 1), which tracks the input signal 205 (FIGS. 2A through 3F), thereby minimizing the dissipated power through an amplifier circuit. Method steps showing several embodiments of the invention are shown in FIGS. 4A through 5B. These embodiments are not intended to limit the scope of the invention but, rather, are provided for illustrative purposes only. Thus, the intent is to cover all alternatives, modifications, and equivalents included within the spirit and scope of the invention as defined by the appended claims.

Figure 4A:
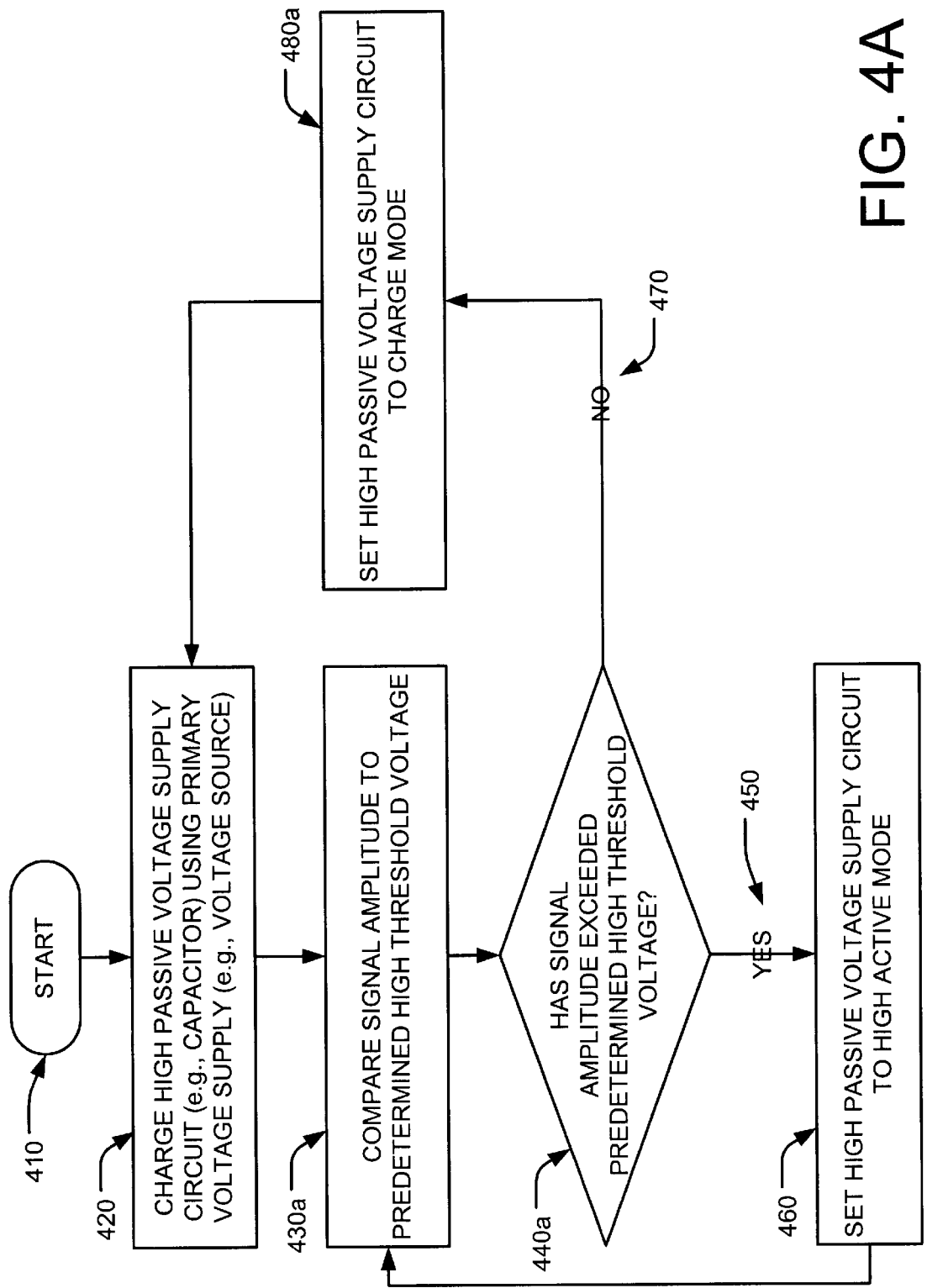
FIG. 4A is a flow chart showing the method steps associated with the circuit diagrams of FIGS. 2C and 2D.

FIG. 4A is a flow chart showing the pertinent method steps associated with the circuit diagrams of FIGS. 2C and 2D, which show the first high-active mode of the two-capacitor power amplifier circuit 200 (FIG. 2D). In the non-limiting example of FIG. 4A, the voltage source 275 (FIG. 2D), in step 420, charges a high passive voltage supply circuit (e.g., capacitor circuit C1 265 (FIG. 2D)), which prepares the amplifier circuit for high active mode operation (FIG. 2D). As input signals 205 (FIG. 2D) are received by the two-capacitor amplifier circuit 200 (FIG. 2D), the system, in step 430a, compares the input signal 205 (FIG. 2D) with a predetermined high threshold voltage. If, in step 440a, the system determines that the input signal 205 (FIG. 2D) has exceeded the predetermined high threshold voltage, then the system, in step 460, sets the high passive voltage supply circuit to high active mode. This supplies additional voltage to the power amplifier circuit, thereby allowing amplification of signals that cause the output to exceed the high voltage rail. If, on the other hand, in step 440a, the system determines that the input signal 205 (FIG. 2D) has not exceeded the predetermined high threshold voltage, then the system, in step 480a, sets the high passive voltage supply circuit to charge mode, thereby allowing the capacitor circuit to charge 420 as the amplifier circuit is driven by only the active voltage supply.

FIG. 4B is a flow chart showing one embodiment of the invention, wherein the initial charging step 420 of FIG. 4A is shown in greater detail. In this non-limiting example, the passive voltage supply is shown as a capacitor while the primary voltage supply is shown as a voltage source. In the charging step 460, the system, in step 422, closes a switch between the positive node of the capacitor and the voltage source, thus, allowing the amplifier circuit to be driven by the voltage source. Additionally, in step 424, the system closes a switch between the negative node of the capacitor and ground, and, in step 426, opens a switch between the negative node of the capacitor and the voltage source, thereby positioning the capacitor between the voltage source and ground. This allows the capacitor to charge while the amplifier circuit is being driven by the voltage source.

FIG. 4C is a flow chart showing the step of setting 480 the circuit of FIG. 2A to active mode in greater detail. In this non-limiting example, the passive voltage supply, which has been charging, is disconnected from between the voltage supply and ground, and positioned between the voltage supply and the plus-stage 225 (FIG. 2C) of the amplifier circuit, thereby effectively increasing the voltage rail 160 (FIG. 1) of the amplifier circuit. The method includes the steps of opening, in step 482, the switch between the negative node of the capacitor and ground; opening, in step 484, the switch between the positive node and the voltage source; and closing, in step 486, the switch between the negative node of the capacitor and the voltage source. The combined opening and closing of switches results in the serial positioning of the capacitor between the voltage supply and the plus-stage of the amplifier circuit, thereby placing the circuit in active mode and effectively increasing the positive voltage rail 160 (FIG. 1).

While FIGS. 4B and 4C provide the details with respect to the specific embodiment of FIG. 4A, it will be clear to one of ordinary skill in the art that the disconnecting and serially connecting the capacitor circuit between the voltage source and the amplifier circuit may be varied depending on other equivalent circuits that may be used to perform similar functions.

Figure 4D:
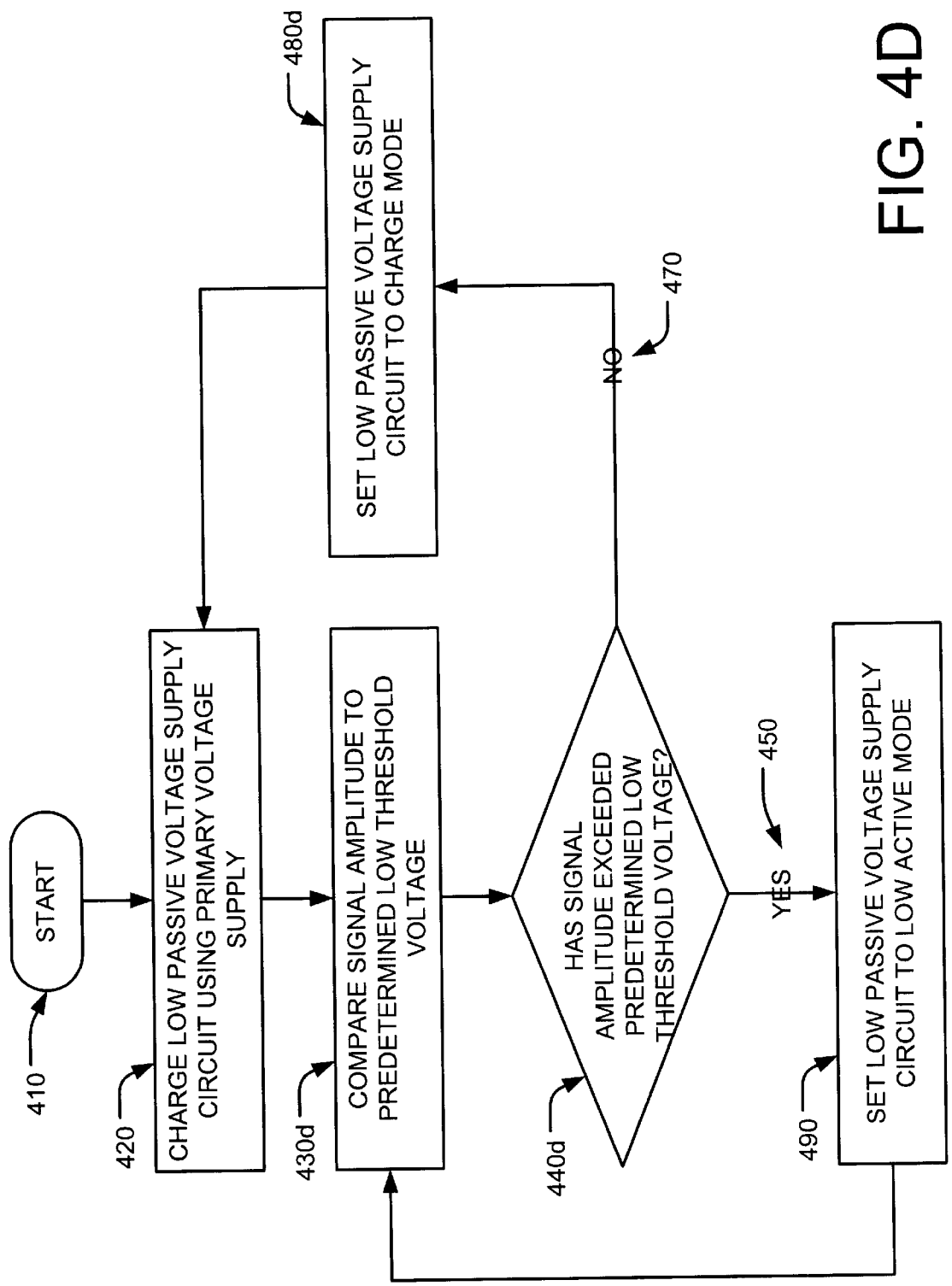
FIG. 4D is a flow chart showing the method steps associated with the circuit diagrams of FIGS. 2C and 2E.

FIG. 4D is a flow chart showing the pertinent method steps associated with the circuit diagrams of FIGS. 2C and 2E, which show the first low-active mode of the two-capacitor power amplifier circuit 200 (FIG. 2E). In the non-limiting example of FIG. 4D, the voltage source 275 (FIG. 2E), in step 420, charges a low passive voltage supply circuit (e.g., capacitor circuit C2 270 (FIG. 2E)), which prepares the amplifier circuit for low-active mode operation. As input signals 205 (FIG. 2E) are received by the two-capacitor amplifier circuit 200 (FIG. 2E), the system, in step 430*d*, compares the input signal 205 (FIG. 2D) with a predetermined low threshold voltage. If, in step 440*d*, the system determines that the input signal 205 (FIG. 2D) has dropped below the predetermined low threshold voltage, then the system, in step 490, sets the high passive voltage supply circuit to low active mode. This supplies additional voltage to the power amplifier circuit, thereby allowing amplification of signals that cause the output to be below the predetermined low threshold voltage. If, on the other hand, in step 440*d*, the system determines that the input signal 205 (FIG. 2E) has not fallen below the predetermined low threshold voltage, then the system, in step 480*d*, sets the low passive voltage supply circuit to charge mode, thereby allowing the capacitor circuit to charge 420 as the amplifier circuit is driven by only the active voltage supply.

FIG. 5A is a flow chart showing the pertinent method steps associated with the circuit diagrams of FIGS. 3B, 3C, and 3E, which show the second high-active mode of the four-capacitor power amplifier circuit 300 (FIG. 3E). In the non-limiting example of FIG. 5A, the amplifier circuit 300 (FIG. 3E), in step 520*a*, charges a high passive voltage supply circuit (e.g., capacitor circuit C1 265 (FIG. 3E)), which prepares the amplifier circuit for high active mode operation. Additionally, in step 530*a*, an additional high passive voltage supply circuit (e.g., capacitor circuit C3 365 (FIG. 3E)) is charged, thus, preparing the amplifier circuit for an additional high active mode operation. As input signals 205 (FIG. 3E) are received by the four-capacitor amplifier circuit 300 (FIG. 3E), the system, in step 540*a*, compares the input signal 205 (FIG. 3E) with a predetermined high threshold voltage. If, in step 542*a*, the system determines that the input signal 205 (FIG. 3E) has exceeded the predetermined high threshold voltage, then the system, in step 560, sets the high passive voltage supply circuit to high active mode and compares the input signal 205 (FIG. 3E) to an additional predetermined high threshold voltage. In other words, if the system determines that the input signal 205 (FIG. 3E) exceeds the predetermined threshold, then the system places C1 265 (FIG. 3E) serially between the voltage supply 275 (FIG. 3E) and the plus-stage 225 (FIG. 3E) of the amplifier circuit to provide a larger range of signal amplification. Once this is done, the system compares the input signal 205 (FIG. 3E) to an additional predetermined high threshold voltage to see if that signal has further exceeded the additional predetermined high threshold voltage. If, in step 570*a*, the system determines that the input signal 205 (FIG. 3E) has also exceeded the additional predetermined high threshold voltage, then the system, in step 590*a*, sets C3 365 (FIG. 3E) to high active mode. In other words, if both predetermined high threshold voltages are exceeded, then both C1 265 (FIG. 3E) and C3 365 (FIG. 3E) are serially placed between the voltage source 275 (FIG. 3E) and the plus-stage 225 of the amplifier circuit, thereby providing a larger voltage supply rail 160 (FIG. 1), and, hence, an even greater range of signal amplification.

If, on the other hand, in step 570*a*, the system determines that the input signal 205 (FIG. 3E) has not exceeded the additional high threshold voltage, then the system sets, in step 580*a*, the passive voltage supply to charge mode. This returns the system to step 530*a*, and the steps of comparing and selectively activating capacitor C3 365 (FIG. 3E) are repeated.

Also, if, in step 542*a*, the system determines that the input signal 205 (FIG. 3E) has not exceeded the predetermined high threshold voltage, then the system, in step 550*a*, sets the high passive voltage supply circuit to charge mode, thereby allowing the capacitor circuit to charge 520*a* as the amplifier circuit is driven by only the active voltage supply 275 (FIG. 3E). This returns the system to step 520*a*, and the steps of comparing and selectively activating the capacitors C1 265 (FIG. 3E) and C3 365 (FIG. 3E) are repeated.

Figure 5B:
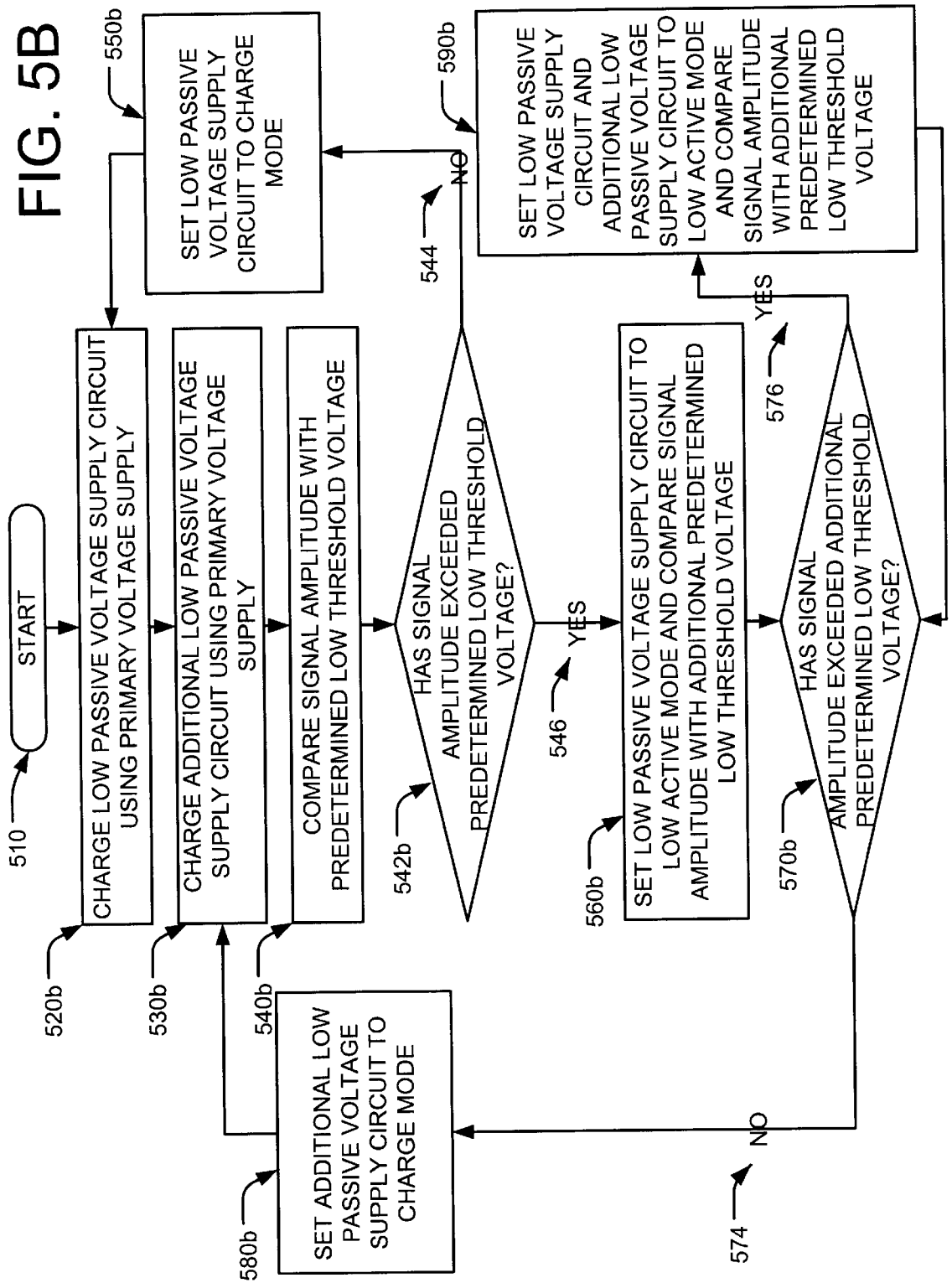
FIG. 5B is a flow chart showing the method steps associated with the circuit diagrams of FIGS. 3B, 3D, and 3F.

FIG. 5B is a flow chart showing the method steps associated with the circuit diagrams of FIGS. 3B, 3D, and 3F, which show the second low-active mode of the four-capacitor power amplifier circuit 300 (FIG. 3F). In the non-limiting example of FIG. 5A, the amplifier circuit 200 (FIG. 3F), in step 520*b*, charges a low passive voltage supply circuit (e.g., capacitor circuit C2 270 (FIG. 3F)), which prepares the amplifier circuit for low active mode operation. Additionally, in step 530*b*, an additional low passive voltage supply circuit (e.g., capacitor circuit C4 370 (FIG. 3F)) is charged, thus, preparing the amplifier circuit for an additional low active mode operation. As input signals 205 (FIG. 3F) are received by the four-capacitor amplifier circuit 300 (FIG. 3F), the system, in step 540*b*, compares the input signal 205 (FIG. 3F) with a predetermined low threshold voltage. If, in step 542*b*, the system determines that the input signal 205 (FIG. 3F) has fallen below the predetermined low threshold voltage, then the system, in step 560*b*, sets the low passive voltage supply circuit to low active mode and compares the input signal 205 (FIG. 3F) to an additional predetermined low threshold voltage. In other words, if the system determines that the input signal 205 (FIG. 3F) has fallen below the predetermined threshold, then the system serially places C2 270 (FIG. 3F) between the voltage supply 275 (FIG. 3F) and the minus-stage 230 (FIG. 3F) of the amplifier circuit to provide a larger range of signal amplification. Once this is done, the system compares the input signal 205 (FIG. 3F) to an additional predetermined low threshold voltage to see if that signal has further fallen below the additional predetermined low threshold voltage. If, in step 570*b*, the system determines that the input signal 205 (FIG. 3F) has also fallen below the additional predetermined low threshold voltage, then the system, in step 590*b*, sets C4 370 (FIG. 3F) to low active mode. In other words, if the input signal 205 (FIG. 3F) has fallen below both predetermined threshold voltages, then both C2 270 (FIG. 3F) and C3 370 (FIG. 3F) are serially placed between the voltage source 275 (FIG. 3F) and the minus-stage 230 of the amplifier circuit, thereby providing a larger voltage supply rail 160 (FIG. 1), and, hence, an even greater range of signal amplification.

If, on the other hand, in step 570*b*, the system determines that the input signal 205 (FIG. 3F) has not fallen below the additional predetermined low threshold voltage, then the system, in step 580*b*, sets the passive voltage supply to charge mode. This returns the system to step 530*b*, and the steps of comparing and selectively activating capacitor C3 370 (FIG. 3F) are repeated.

Also, if, in step 542*a*, the system determines that the input signal 205 (FIG. 3F) has not fallen below the predetermined low threshold voltage, then the system, in step 550*b*, sets the low passive voltage supply circuit to charge mode, thereby allowing the capacitor circuit to charge 520*b* as the amplifier circuit is driven by only the voltage supply 275 (FIG. 3F). This returns the system to step 520*b*, and the steps of comparing and selectively activating the capacitors C2 270 (FIG. 3F) and C3 370 (FIG. 3F) are repeated.

As one can see, the operation, in general, comprises the steps of comparing the input signal to a plurality of predetermined threshold voltages and, depending on whether the signal has exceeded the predetermined thresholds, selectively adding charged capacitors to the amplifier circuit to proportionally increase or decrease the voltage rail as a function of the input signal.

While several of the method steps in the non-limiting examples are shown as sequential steps, it will be clear to one of ordinary skill in the art that these steps may be performed concurrently or out of order. For example, while the step of comparing the input signal to a predetermined threshold voltage is shown as a distinct step, it will be clear to one of ordinary skill in the art that a comparator may continuously monitor the input signal while the remaining steps are being performed. Also, while the operation of opening and closing switches are shown in sequential order, it will be clear to one of ordinary skill in the art that these switches may open and close simultaneously or in a different order than presented in the preferred embodiment without detracting from the scope of the invention. Additionally, while the preferred embodiment shows a certain configuration of capacitors and switches, it will be clear to one of ordinary skill in the art that the capacitors and switches may be rearranged to produce equivalent circuits that perform in a similar manner. For example, while the illustrated non-limiting example of FIG. 2B shows the output load of the amplifier circuit connected to ground, the amplifier circuit may be configured as a balanced amplifier, which has its output load connected between the outputs of two amplifier circuits. Such changes are intended to be within the scope of the present invention and, thus, the intent is to cover all alternatives, modifications, and equivalents included within the spirit and scope of the invention as defined by the appended claims.

I claim:

1. A system for variably adjusting the voltage supply of a power amplifier circuit comprising:
    a power amplifier;
    a primary voltage supply configured to supply constant voltage to the power amplifier;
    a control circuit configured to compare an input signal to a predetermined threshold, the control circuit further configured to generate a charge mode signal and an active mode signal, the charge mode signal generated in response to the input signal not exceeding the predetermined threshold, the active mode signal generated in response to the input signal exceeding the predetermined threshold;
    a capacitor circuit configured to receive the charge mode signal and the active mode signal, the capacitor circuit further configured to charge to approximately the predetermined voltage of the voltage supply in response to the charge mode signal, the capacitor circuit further configured to supply voltage in conjunction with the voltage supply to the power amplifier in response to the active mode signal.

2. A system for providing additional voltage to a power amplifier circuit having a single voltage source, the system comprising:
    a passive voltage supply circuit configured to selectively provide voltage to a power amplifier circuit in response to a control signal; and
    a control circuit connected to the passive voltage supply, the control circuit further comprising:
        a receiver configured to receive an input signal;
        a comparator circuit configured to compare the received input signal with a predetermined threshold, the comparator circuit further configured to produce the control signal, the control signal being a charge mode signal when the input signal does not exceed the predetermined threshold, the control signal further being an active mode signal when the input signal exceeds the predetermined threshold; and
        a plurality of switches configured to receive the control signal, the plurality of switches configured to set the passive voltage supply circuit to charge mode in response to the charge mode signal, the plurality of switches further configured to set the passive voltage supply circuit to active mode in response to the active mode signal.

3. The system of claim 2, wherein the passive voltage supply circuit is a capacitor circuit.

4. The system of claim 2, wherein the power amplifier circuit is configured as a balanced amplifier circuit.

5. The system of claim 3, wherein the capacitor circuit is located between a first voltage supply and ground, the capacitor circuit further configured to store a voltage approximately equal to the voltage of the first voltage supply.

6. The system of claim 3, wherein the capacitor circuit is located between a first voltage source and a second voltage source, the capacitor circuit further configured to store a voltage approximately equal to the voltage difference between the first voltage source and the second voltage source.

7. The system of claim 2, wherein the comparator circuit is a digital comparator.

8. The system of claim 2, wherein the comparator circuit is an analog comparator.

9. The system of claim 2, wherein the passive voltage supply circuit stores energy in charge mode.

10. The system of claim 2, wherein the passive voltage supply circuit provides additional voltage to a power amplifier circuit in active mode.

11. The system of claim 2, further comprising:
    at least one additional passive voltage supply circuit configured to selectively provide additional voltage to a power amplifier circuit in response to at least one additional control signal; and
    at least one additional control circuit connected to the at least one additional passive voltage supply circuit, the at least one additional control circuit configured to produce the at least one additional control signal, the at least one additional control signal configured to control the operational mode of the at least one additional passive voltage supply circuit.

12. The system of claim 11, wherein the at least one additional passive voltage supply circuit is a capacitor circuit.

13. The system of claim 11, wherein the at least one additional control circuit comprises:
    at least one receiver configured to receive an input signal;
    at least one comparator circuit configured to compare the received input signal to at least one additional predetermined threshold, the at least one comparator circuit further configured to produce the at least one additional control signal, the at least one additional control signal being a charge mode signal when the input signal does not exceed the at least one additional predetermined threshold, the control signal further being an active mode signal when the input signal exceeds the at least one additional predetermined threshold;
    a plurality of switches configured to receive the at least one additional control signal, the plurality of switches configured to set the at least one additional passive voltage supply circuit to charge mode in response to the charge mode signal, the plurality of switches further configured to set the at least one additional passive voltage supply circuit to active mode in response to the active mode signal.

14. The system of claim 13, wherein the at least one additional passive voltage supply circuit stores energy in charge mode.

15. The system of claim 13, wherein the at least one additional passive voltage supply circuit provides additional voltage to a power amplifier circuit in active mode.

16. A method for providing additional voltage to a power amplifier circuit having a single voltage source, the method comprising the steps of:
    comparing an input signal to a predetermined threshold;
    producing a control signal in response to the comparing step, the control signal being a charge mode signal when the input signal does not exceed the predetermined threshold, the control signal being an active mode signal when the input signal exceeds the predetermined threshold;
    charging a passive voltage supply circuit in response to the control signal being a charge mode signal; and
    activating the passive voltage supply circuit to provide voltage to a power amplifier in response to the control signal being an active mode signal.

17. The method of claim 16, wherein the step of charging the passive voltage supply circuit further comprises the step of charging a capacitor circuit.

18. The method of claim 16, wherein the step of activating the passive voltage supply circuit comprises the step placing a charged capacitor circuit in series between an active voltage source and the power amplifier.

19. The method of claim 16, further comprising the steps of:
    comparing the input signal to at least one additional predetermined threshold;
    producing at least one additional control signal in response to the comparing step, the at least one additional control signal being a charge mode signal when the input signal does not exceed the at least one additional predetermined threshold, the at least one additional control signal being an active mode signal when the input signal exceeds the at least one additional predetermined threshold;
    charging at least one additional passive voltage supply circuit in response to the at least one additional control signal being a charge mode signal; and
    activating the at least one additional passive voltage supply circuit to provide additional voltage to a power amplifier in response to the at least one additional control signal being an active mode signal.

20. A system for providing additional voltage to a power amplifier circuit having a single voltage source, the system comprising:
    voltage supply means for selectively providing voltage to a power amplifier, the voltage supply means comprising passive energy storage means for storing energy; and
    controlling means for controlling the voltage supply means, the controlling means further comprising:
        comparing means for comparing an input signal with a predetermined threshold, the comparing means further for generating a control signal, the control signal being a charge mode signal when the input signal does not exceed the predetermined threshold, the control signal being an active mode signal when the input signal exceeds the predetermined threshold; and
        switching means for receiving the control signal, the switching means further for charging the voltage supply means in response to the charge mode signal, the switching means further for supplying power to a power amplifier in response to the active mode signal.

21. The system of claim 20, wherein the passive energy storage means is a capacitor circuit.

22. The system of claim 21, further comprising:
    at least one additional voltage supply means for selectively providing additional voltage to a power amplifier, the at least one additional voltage supply means comprising at least one additional passive energy storage means for storing energy; and
    at least one additional controlling means for controlling the at least one additional voltage supply means.

* * * * *